(12) United States Patent
Yoo

(10) Patent No.: US 12,310,035 B2
(45) Date of Patent: May 20, 2025

(54) ELECTRONIC DEVICE AND METHOD OF MANUFACTURING THE SAME

(71) Applicant: SK hynix Inc., Icheon (KR)

(72) Inventor: Si Jung Yoo, Icheon (KR)

(73) Assignee: SK hynix Inc., Icheon (KR)

(*) Notice: Subject to any disclaimer, the term of this patent is extended or adjusted under 35 U.S.C. 154(b) by 629 days.

(21) Appl. No.: 17/591,263

(22) Filed: Feb. 2, 2022

(65) Prior Publication Data
US 2023/0065033 A1   Mar. 2, 2023

(30) Foreign Application Priority Data
Aug. 26, 2021   (KR) .................. 10-2021-0113499

(51) Int. Cl.
*H10B 63/00*   (2023.01)
*H10B 61/00*   (2023.01)
*H10N 50/01*   (2023.01)
*H10N 70/00*   (2023.01)

(52) U.S. Cl.
CPC .............. *H10B 63/80* (2023.02); *H10B 61/10* (2023.02); *H10B 63/20* (2023.02); *H10N 50/01* (2023.02); *H10N 70/011* (2023.02)

(58) Field of Classification Search
CPC ........ H10B 61/10; H10B 63/20; H10B 63/80; H10N 50/01; H10N 70/011
USPC ............................................................ 257/5
See application file for complete search history.

(56) References Cited

U.S. PATENT DOCUMENTS

| | | | |
|---|---|---|---|
| 10,283,703 B2 | 5/2019 | Pellizzer et al. | |
| 2019/0181341 A1* | 6/2019 | Choi | H10N 70/8833 |
| 2020/0098988 A1* | 3/2020 | Kim | H10B 63/84 |
| 2021/0296329 A1* | 9/2021 | Kim | G11C 11/22 |
| 2022/0052116 A1* | 2/2022 | Lee | H10B 63/24 |

FOREIGN PATENT DOCUMENTS

KR   101164358 B1   7/2012

* cited by examiner

*Primary Examiner* — Igwe U Anya

(57) ABSTRACT

The present technology relates to an electronic device and a method of manufacturing the same. The electronic device includes a semiconductor memory. The semiconductor memory includes row lines each extending in a first direction, column lines each extending in a second direction crossing the first direction, memory cells positioned at intersections of the row lines and the column lines, and including first sidewalls facing in the first direction and second sidewalls facing in the second direction, first protective layers respectively formed on the second sidewalls of the memory cells, and second protective layers respectively formed on the first sidewalls of the memory cells. A group of the second protective layers partially surround a sidewall of a corresponding one of the column lines.

21 Claims, 29 Drawing Sheets

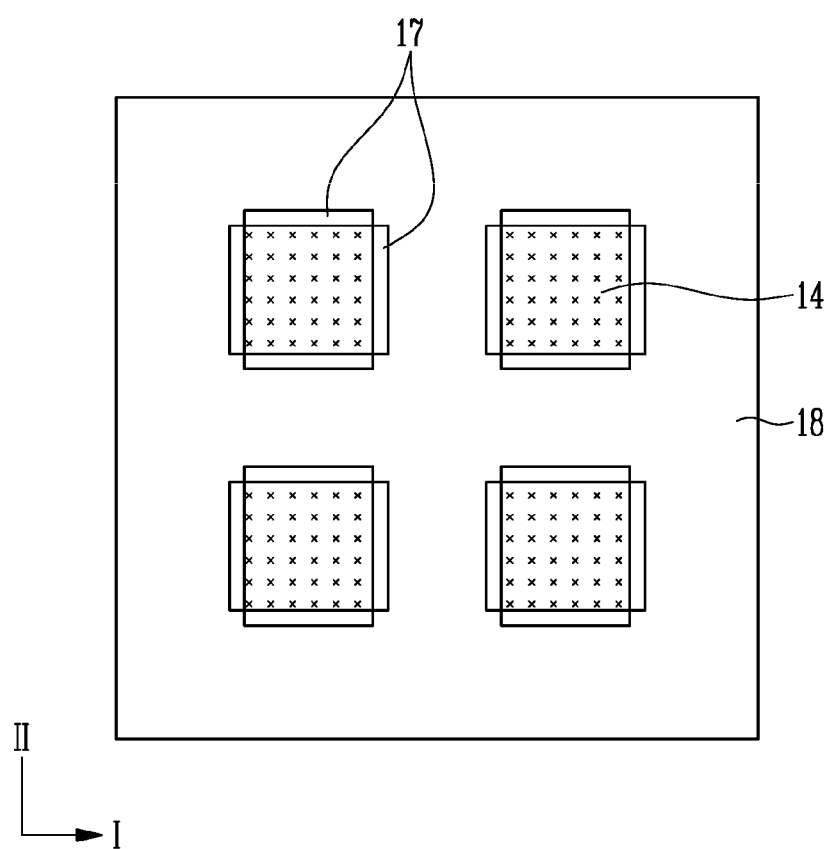

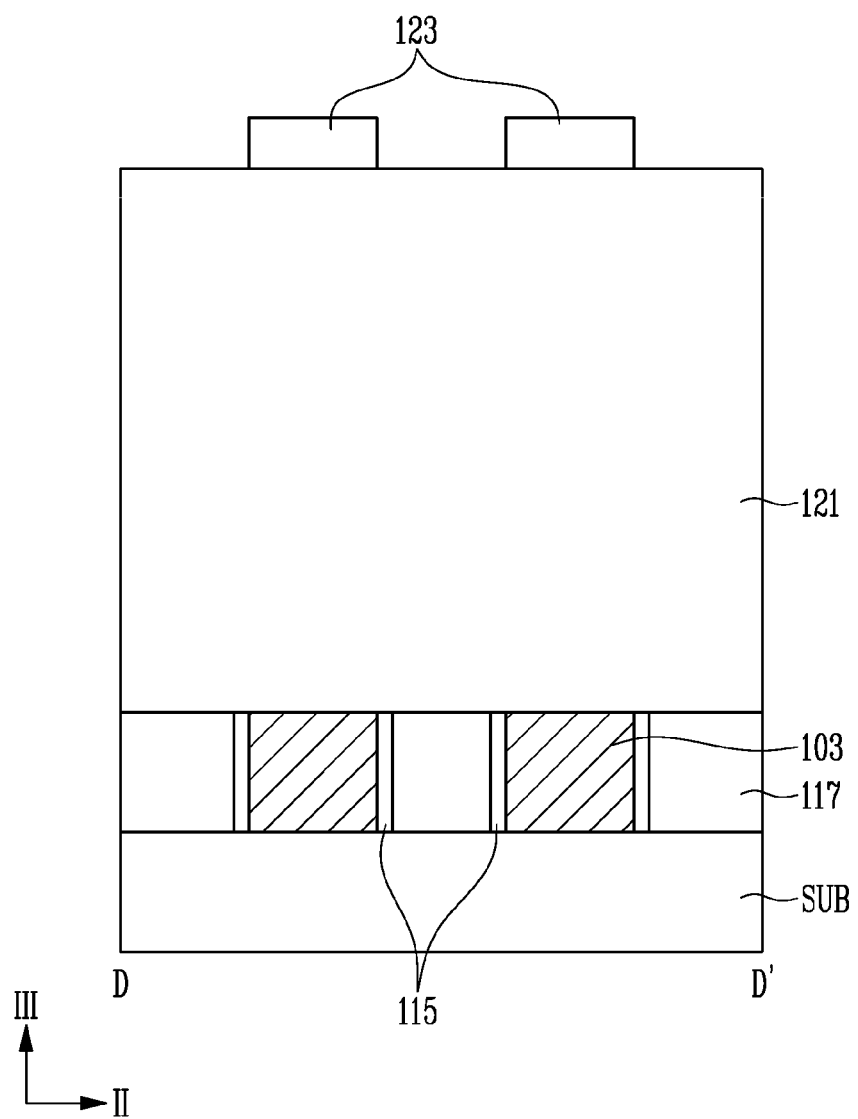

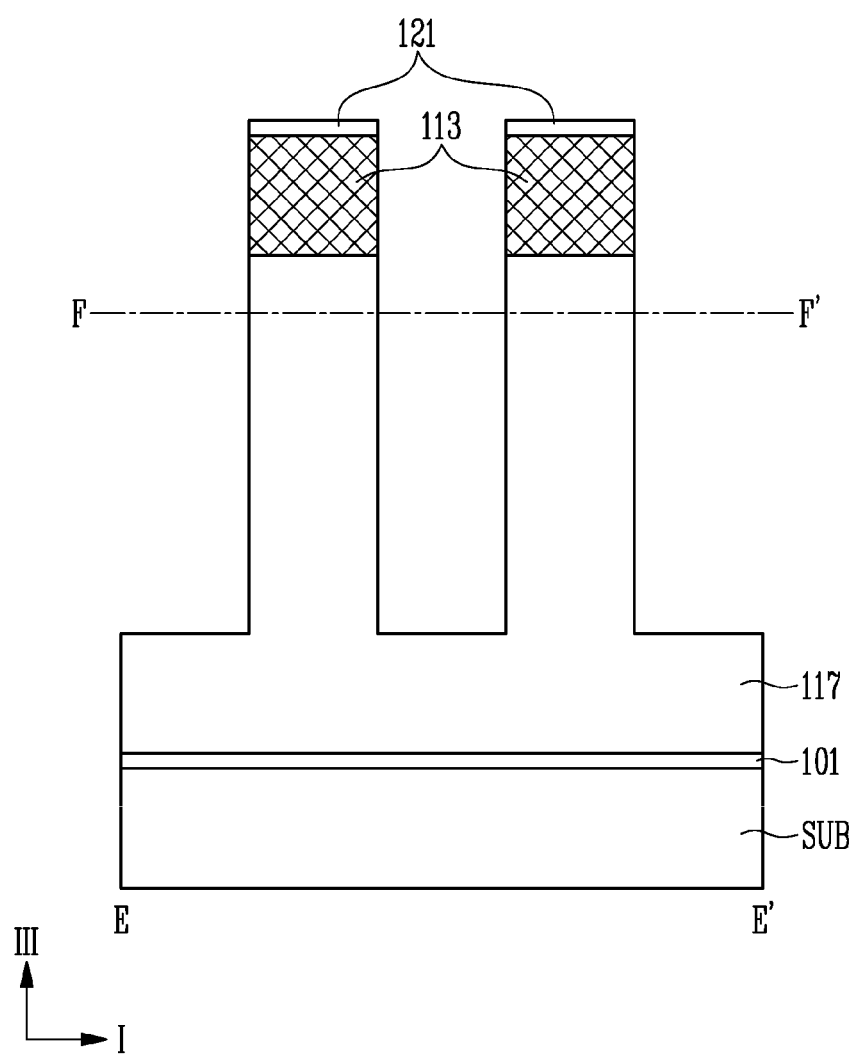

ELECTRONIC DEVICE AND METHOD OF MANUFACTURING THE SAME

CROSS-REFERENCE TO RELATED APPLICATION

The present application claims priority under 35 U.S.C. § 119 (a) to Korean patent application number 10-2021-0113499, filed on Aug. 26, 2021, in the Korean Intellectual Property Office, the entire disclosure of which is incorporated herein by reference.

BACKGROUND

1. Field of Invention

The present disclosure relates to an electronic device, and more particularly, to an electronic device including a semiconductor memory and a method of manufacturing the electronic device.

2. Description of Related Art

In recent years, a semiconductor device capable of storing information in various electronic devices such as a computer and a portable communication device has been demanded, according to miniaturization, low power consumption, high performance, and diversification of an electronic device. Therefore, study on a semiconductor device capable of storing data by using a switching characteristic between different resistance states according to an applied voltage or current has been conducted. Examples of such a semiconductor device include a resistive random access memory (RRAM), a phase-change random access memory (PRAM), a ferroelectric random access memory (FRAM), a magnetic random access memory (MRAM), an e-fuse, and the like.

SUMMARY

An embodiment of the present disclosure provide an electronic device capable of improving an operation characteristic and reliability of a memory cell, and a method of manufacturing the electronic device.

According to an embodiment of the present disclosure, an electronic device includes a semiconductor memory. The semiconductor memory includes row lines each extending in a first direction, column lines each extending in a second direction crossing the first direction, memory cells positioned at intersections of the row lines and the column lines, and including first sidewalls facing in the first direction and second sidewalls facing in the second direction, first protective layers respectively formed on the second sidewalls of the memory cells, and second protective layers respectively formed on the first sidewalls of the memory cells, and wherein a group of the second protective layers partially surround a sidewall of a corresponding one of the column lines.

According to an embodiment of the present disclosure, a method of manufacturing an electronic device includes forming a plurality of stack structures including a plurality of row lines and a plurality of variable resistance layers, respectively, each of the plurality of stack structures extending in a first direction, forming a first protective layer on sidewalls of the plurality of stack structures, forming a first insulating layer between the plurality of stack structures, forming column lines crossing the row lines on the first insulating layer, forming a plurality of stack patterns including memory cells positioned at intersections of the row lines and the column lines by etching the first insulating layer, the first protective layer, and the plurality of stack structures, forming a second protective layer on sidewalls of the plurality of stack patterns, forming a second insulating layer between the plurality of stack patterns, forming a mask pattern overlapping one or more of the column lines and one or more of the row lines on the second insulating layer, and etching the second protective layer using the mask pattern as an etch barrier.

According to an embodiment of the present disclosure, a method of manufacturing an electronic device includes forming a plurality of stack structures including a plurality of first lines and a plurality of variable resistance layers, each of the plurality of stack structures extending in a first direction, forming a first protective layer on sidewalls of the plurality of stack structures, forming a first insulating layer between the plurality of stack structures, forming second lines crossing the first lines on the first insulating layer, forming a plurality of stack patterns including memory cells positioned at intersections of the first lines and the second lines by etching the first insulating layer, the first protective layer, and the plurality of stack structures, forming a second protective layer on sidewalls of the plurality of stack patterns, forming a second insulating layer between the plurality of stack patterns, forming a mask pattern overlapping a corresponding one the first lines on the second insulating layer, and etching the second protective layer using the mask pattern and the second lines as an etch barrier.

Using an electronic device and a method of manufacturing the same according to the above-described embodiments of the present disclosure, an operation characteristic and reliability of the memory cell may be improved.

BRIEF DESCRIPTION OF THE DRAWINGS

FIGS. 2A, 2B, and 2C are diagrams illustrating a structure of an electronic device according to an embodiment of the present disclosure.

FIGS. 3A, 3B, 4A, 4B, 5A, 5B, 6A, 6B, 7, 8A, 8B, 8C, 9A, 9B, and 10 are diagrams illustrating a method of manufacturing an electronic device according to an embodiment of the present disclosure.

DETAILED DESCRIPTION

Specific structural or functional descriptions of embodiments according to the concept which are disclosed in the present specification or application are illustrated only to describe some embodiments according to the concept of the present disclosure. Embodiments according to the concept of the present disclosure may be carried out in various forms and should not be construed as being limited to the embodiments described in the present specification or application.

Figure 1:
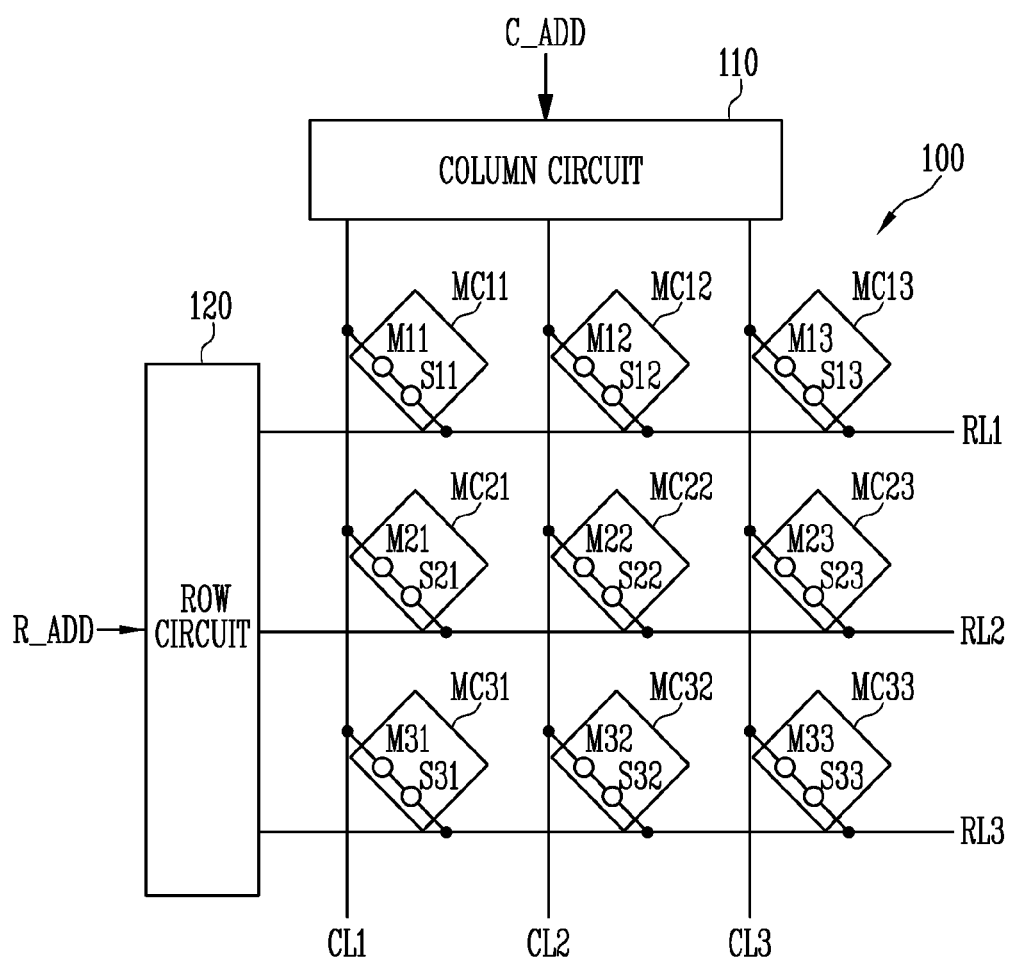
FIG. 1 is a diagram illustrating a structure of an electronic device according to an embodiment of the present disclosure, and is a circuit diagram of a cell array.

FIG. 1 is a diagram illustrating a structure of an electronic device according to an embodiment of the present disclosure, and is a circuit diagram of a cell array.

Referring to FIG. 1, the electronic device according to an embodiment of the present disclosure may include a semiconductor memory. The semiconductor memory may be a nonvolatile memory device and may be a variable resistance memory device. The semiconductor memory may include row lines (e.g., row lines RL1 to RL3) and column lines (e.g., column lines CL1 to CL3) intersecting the row lines. Here, the row lines may be word lines, and the column lines may be bit lines. For reference, the word line and bit line are relative concepts, and the row lines may be bit lines and the column lines may be word lines.

The cell array 100 may include memory cells MC11 to MC33 disposed between column lines CL1 to CL3 and the lines RL1 to RL3, respectively. Here, the memory cells MC11 to MC33 may be disposed at points where the column lines CL1 to CL3 and the row lines RL1 to RL3 intersect. Each of the memory cells MC11 to MC33 may include at least one of select elements S11 to S33 or memory elements M11 to M33. For example, each of the memory cells MC11 to MC33 includes the select elements S11 to S33 and the memory elements M11 to M33 connected in series. The select elements S11 to S33 may be electrically connected to the row lines RL1 to RL3, and the memory elements M11 to M33 may be electrically connected to the column lines CL1 to CL3.

The memory elements M11 to M33 may include a variable resistance material as a storage node for storing data. The variable resistance material may be a resistive material, a magnetic tunnel junction (MTJ), a phase change material, or the like. The select elements S11 to S33 are for selecting a memory cell MC and may include a switching material. The select elements S11 to S33 may be a diode, a PNP diode, a transistor, a vertical transistor, a bipolar junction transistor (BJT), a metal insulator transition (MIT) element, a mixed ionic-electronic conduction (MIEC) element, an ovonic threshold switching (OTS) element, or the like.

For reference, a shape and a configuration of each of the memory cells MC11 to MC33 may be variously modified. For example, the select elements S11 to S33 may be omitted, or the memory elements M11 to M33 may be omitted. Alternatively, positions of the select elements S11 to S33 and the memory elements M11 to M33 may be reversed. The select elements S11 to S33 may be electrically connected to the column lines CL1 to CL3, and the memory elements M11 to M33 may be electrically connected to the row lines RL1 to RL3.

In addition, the semiconductor memory may further include a column circuit 110 for controlling the column lines CL1 to CL3 and a row circuit 120 for controlling the row lines RL1 to RL3.

The row circuit 120 may be a row decoder, a word line decoder, a word line driver, or the like. The row circuit 120 may select the row line RL2 among the row lines RL1 to RL3 according to a row address R_ADD. The column circuit 110 may be a column decoder, a bit line decoder, a bit line driver, or the like. The column circuit 110 may select the column line CL2 among the column lines CL1 to CL3 according to a column address C_ADD. Therefore, the memory cell MC22 connected between the selected column line CL2 and the selected row line RL2 may be selected.

For reference, FIG. 1 shows three column lines CL1 to CL3 and three row lines RL1 to RL3, but this is merely for convenience of description, and embodiments of the present disclosure are not limited thereto. The number of the column lines CL1 to CL3 and the row lines RL1 to RL3 included in the cell array 100 may be changed as occasion demands.

Figure 2A:
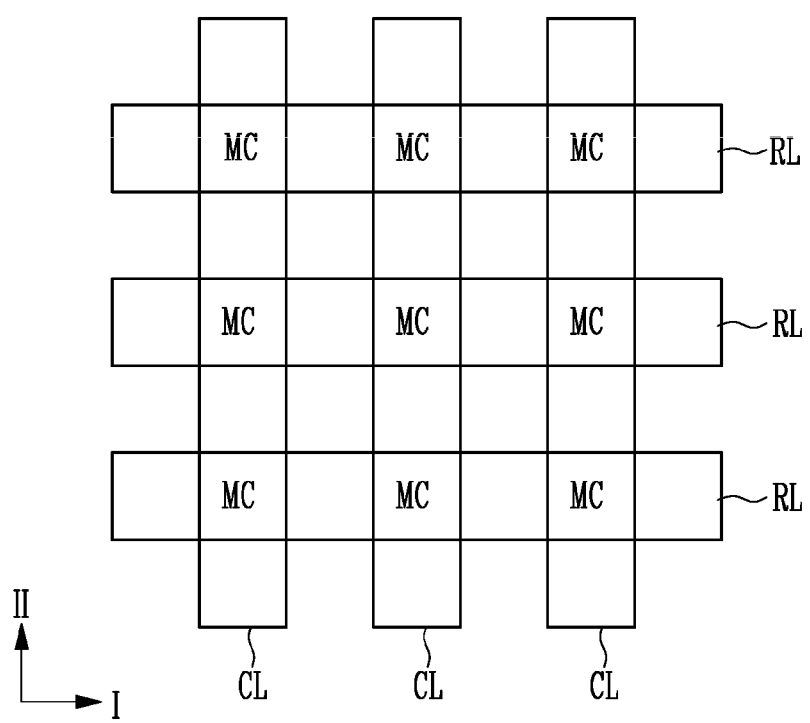
Figure 2B:
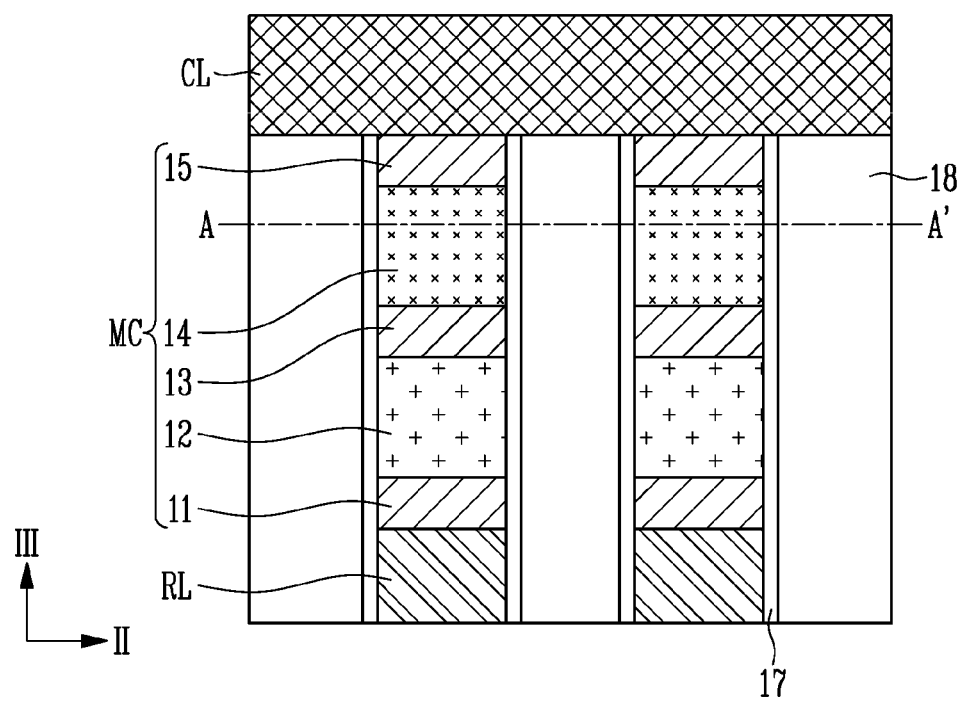

FIGS. 2A, 2B, and 2C are diagrams illustrating a structure of an electronic device according to an embodiment of the present disclosure.

Referring to FIGS. 2A to 2C, the electronic device according to an embodiment of the present disclosure may include a semiconductor memory, and the semiconductor memory may include row lines RL, column lines CL, and memory cells MC. Protective layers 17 may be formed on a sidewall of the memory cell MC. Insulation layers 18 may be formed between adjacent memory cells MC, between adjacent row lines RL, and between adjacent column lines CL.

The row lines RL may extend in a first direction I. The first direction I may be defined as a word line direction. The column lines CL may extend in a second direction II intersecting the first direction I. The second direction II may be defined as a bit line direction. The row lines RL and the column lines CL may be positioned at different levels in a third direction III. The third direction III may intersect the first direction I and the second direction II. For example, the third direction III may be orthogonal to a plane defined by the first direction I and the second direction II.

Each of the memory cells MC may include a first electrode 11, a switching layer 12, a second electrode 13, a variable resistance layer 14, and a third electrode 15. The first electrode 11, the switching layer 12, the second electrode 13, the variable resistance layer 14, and the third electrode 15 may be stacked in the third direction III.

The variable resistance layer 14 may include a resistive material. The variable resistance layer 14 may include a transition metal oxide or may include a metal oxide such as a perovskite-based material. Therefore, an electrical path may be generated or extinguished in the variable resistance layer 14, and thus data may be stored.

The variable resistance layer 14 may have an MTJ structure. The variable resistance layer 14 may include a magnetization fixed layer, a magnetization free layer, and a tunnel barrier layer interposed therebetween. The magnetization fixed layer and the magnetization free layer may include a magnetic material. The tunnel barrier layer may include an oxide such as magnesium (Mg), aluminum (Al), zinc (Zn), or titanium (Ti). Here, a magnetization direction of the magnetization free layer may be changed by a spin torque of electrons in an applied current. Therefore, data may be stored according to the change of the magnetization direction of the magnetization free layer with respect to a magnetization direction of the magnetization fixed layer.

The variable resistance layer 14 may include a phase change material, and may include a chalcogenide glass, a chalcogenide alloy, or the like. The variable resistance layer 14 may include silicon (Si), germanium (Ge), antimony (Sb), tellurium (Te), bismuth (Bi), indium (In), tin (Sn), selenium (Se), carbon (C), nitrogen (N), oxygen (O), or the like, or a combination thereof. For example, the variable resistance layer 14 may be Ge—Sb—Te (GST), and may be $Ge_2Sb_2Te_7$, $Ge_2Sb_2Te_7$, $Ge_1Sb_2Te_4$, $Ge_1Sb_4Te_7$, and the like. The variable resistance layer 14 may change in phase according to a program operation. The variable resistance layer 14 may have a crystalline state of a low resistance by a set operation. The variable resistance layer 14 may have an amorphous state of a high resistance by a reset operation. Therefore, data may be stored in the memory cell MC by using a resistance difference according to the phase of the variable resistance layer 14.

The variable resistance layer 14 may include a variable resistance material of which a resistance changes without a phase change, and may include a chalcogenide-based material. The variable resistance layer 14 may include germanium (Ge), antimony (Sb), telerium (Te), arsenic (As), selenium (Se), silicon (Si), indium (In), tin (Sn), sulfur(S), gallium (Ga), carbon (C), nitrogen (N), oxygen (O), or the like, or may include a combination thereof. The variable resistance layer 14 may have a specific phase, and the phase may be maintained during the program operation. For example, the variable resistance layer 14 has the amorphous state and is not changed to the crystalline state during the program operation. Therefore, a threshold voltage of the memory cell MC may be changed according to a program pulse applied to the memory cell MC, and the memory cell MC may be programmed to at least two states. The variable resistance layer 14 may have the amorphous state of the high resistance by the reset operation, and the memory cell MC may be programmed to the reset state of a high threshold voltage. The variable resistance layer 14 may have the amorphous state of the low resistance by the set operation, and the memory cell MC may be programmed to the set state of a low threshold voltage.

The switching layer 12 may be a select element that adjusts a current flow according to a magnitude of an applied voltage or current. The switching layer 12 may have a characteristic of hardly flowing a current when the magnitude of the applied voltage or current is equal to or less than a threshold value and flowing a current which rapidly increases when the magnitude of the applied voltage or current is greater than the threshold value.

When the switching layer 12 is a metal insulator transition (MIT) element, the switching layer 12 may include $VO_2$, $NbO_2$, $TiO_2$, $WO_2$, $TiO_2$, or the like. When the switching layer 12 is a mixed ion-electron conducting (MIEC) element, the switching layer 12 may include $ZrO_2$ $(Y_2O_3)$, $Bi_2O_3$—BaO, $(La_2O_3)x(CeO_2)_{1-x}$, or the like. In addition, when the switching layer 12 is an ovonic threshold switching (OTS) element, the switching layer 12 may include Te, Se, Ge, Si, As, Ti, S, Sb, C, N, O, or the like. For example, the switching layer 12 may include a chalcogenide-based material such as AsTe, AsSe, AsTeSe, AsTeGe, AsSeGe, or AsTeGeSe.

The first electrode 11 may be electrically connected to the row line RL. The second electrode 13 may be interposed between the switching layer 12 and the variable resistance layer 14. The third electrode 15 may be electrically connected to the column line CL. Each of the first to third electrodes 11, 13, and may be a single layer or multiple layers. An interface between the multiple layers may be surface-treated to reduce a surface roughness. In addition, at least one of the first to third electrodes 11, 13, and 15 may have a surface roughness of 30 Å or less.

An electrode material included in the first electrode 11, the second electrode 13, and the third electrode 15 may be determined in consideration of diffusion prevention, chemical reactivity, contact resistance, bulk resistance, surface roughness, and the like. The electrode material may be a material that substantially prevents or minimizes material movement between peripheral layers, for example, between the variable resistance layer 14 and the switching layer 12. The electrode material may be a material having low chemical reactivity with peripheral layers, for example, the variable resistance layer 14 or the switching layer 12. The electrode material may be a material that forms an ohmic contact with peripheral layers, for example, the variable resistance layer 14 or the switching layer 12. In addition, the electrode material may be a material having high density, low resistance (resistivity), and low roughness.

The electrode material may include a conductive material such as metal, or metal nitride. Each of the first electrode 11, the second electrode 13, and the third electrode 15 may include tungsten (W), tungsten nitride (WN), tungsten silicide (WSi), tungsten silinitride (WSIN), titanium (Ti), titanium nitride (TIN), titanium silicon nitride (TiSiN), titanium aluminum nitride (TIAlN), tantalum (Ta), tantalum nitride (TaN), tantalum silicon nitride (TaSiN), tantalum aluminum nitride (TaAlN), carbon (C), carbon nitride (CNx), silicon carbide (SiC), silicon carbon nitride (SiCN), copper (Cu), zinc (Zn), nickel (Ni), cobalt (Co), lead (Pd), platinum (Pt), or the like, and may include a combination thereof.

According to the structure as described above, the first electrode 11, the switching layer 12, and the second electrode 13 may configure the select element. The second electrode 13, the variable resistance layer 14, and the third electrode 15 may configure a memory element. In addition, the select element and the memory element may share the second electrode 13. The memory cell MC may not include the memory element and may include only the select element. In this case, the select element may function as a switch and store data.

Referring to FIG. 2C, the protective layers 17 may be formed on all sidewalls of the variable resistance layer 14 in a given thickness (e.g., a predetermined thickness). In addition to the sidewalls of the variable resistance layer 14, the protective layers 17 may be formed in a predetermined thickness on sidewalls of the first electrode 11, the switching layer 12, the second electrode 13, and the third electrode 15.

The protective layers 17 are formed on the sidewalls of the variable resistance layer 14, and the protective layers 17 adjacent to each other at each corner of the variable resistance layer 14 are formed to be spaced apart from each other. That is, the protective layer 17 may be formed on each sidewall of the variable resistance layer 14 in a predetermined thickness, and each corner of the variable resistance layer 14 may have a structure in which the protective layer 17 is cut. For example, first to fourth protective layers 17 may be formed on first to fourth sidewalls of the variable resistance layer 14, respectively, without wrapping around four corners of the variable resistance layer 14, and each of the first to fourth protective layers 17 may have a predetermined thickness in a direction perpendicular to a corresponding sidewall of the variable resistance layer 14. At this time, all sidewalls of the variable resistance layer 14 are not exposed by the protective layers 17. In addition, the protective layer 17 formed on the sidewall of the variable resistance layer 14 included in one memory cell does not extend in a direction toward an adjacent memory cell. The protective layer 17 may partially surround sidewalls of the memory cells in the column line direction.

FIGS. 3A, 3B, 4A, 4B, 5A, 5B, 6A, 6B, 7, 8A, 8B, 8C, 9A, 9B, and 10 are diagrams illustrating a method of manufacturing an electronic device according to an embodiment of the present disclosure.

Figure 3A:
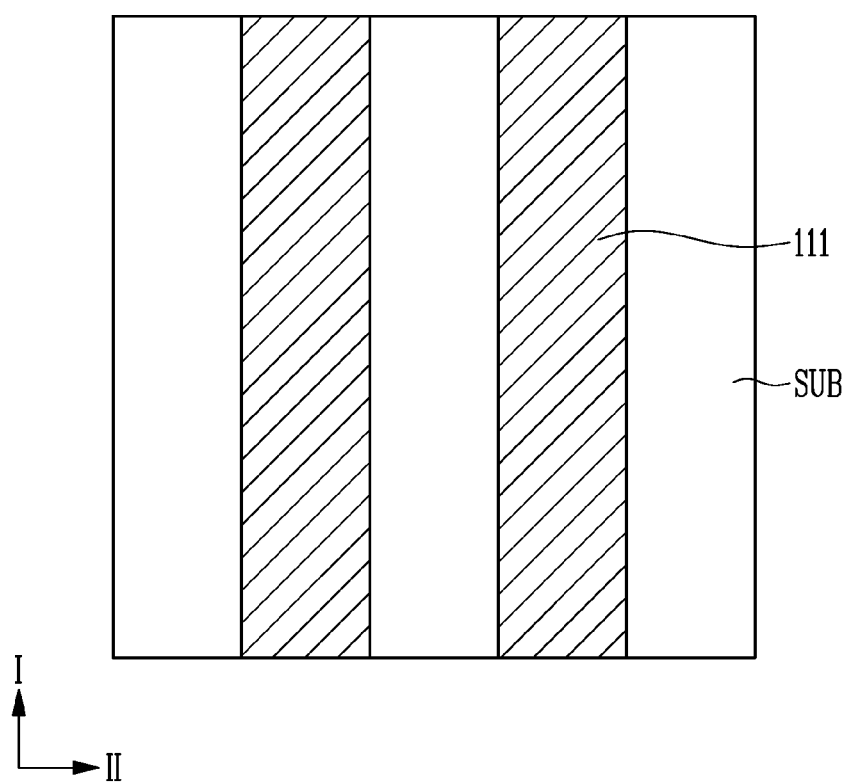
Figure 3B:
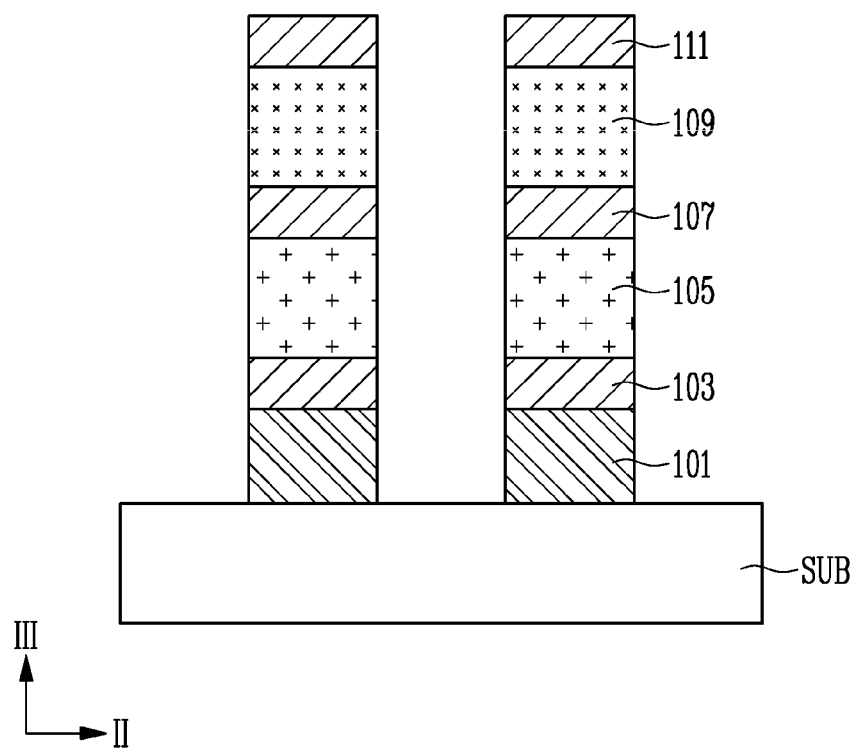

FIG. 3A is a layout diagram of a semiconductor memory included in an electronic device, and FIG. 3B is a cross-sectional view taken in the second direction II in FIG. 3A.

Referring to FIGS. 3A and 3B, a substrate SUB may be provided. The substrate SUB may include a semiconductor material such as silicon. The substrate SUB may include a desired predetermined lower structure (not shown). As an example, the substrate SUB may include a transistor or the like connected to a first line 101 and/or a second line 103, which will be described later, to control supply of a current or a voltage.

Subsequently, the first line 101, and a plurality of stack structures including stack patterns 103, 105, 107, 109, and 111 for forming the memory cell may be formed on the substrate SUB.

The first line 101 and the stack patterns 103, 105, 107, 109, and 111 may have a line shape extending in the first direction I. The plurality of stack structures may be arranged to be spaced apart from each other in the second direction II substantially perpendicular to the first direction I.

The plurality of stack structures may be formed by sequentially stacking a conductive layer for forming the first line 101 and a plurality of material layers for forming the stack patterns 103, 105, 107, 109, and 111 on the substrate SUB, and then etching the conductive layers and the material layers using a mask pattern of a line shape extending in the first direction I.

The first line 101 may be connected to a lower end of the memory cell to transmit a current or a voltage, and may have a single layer structure or a multiple layer structure including various conductive materials such as metal and metal nitride. The first line 101 may function as a local line. The first line 101 may function as the word line or the bit line.

The stack patterns 103, 105, 107, 109, and 111 may be additionally patterned in a subsequent process to be transformed into the memory cell, and may be a portion for storing data. The stack patterns 103, 105, 107, 109, and 111 may include a variable resistance element capable of storing data by switching between different resistance states according to a current or a voltage supplied through an upper end and a lower end thereof. For example, the stack pattern may include a first electrode 103, a switching layer 105, a second electrode 107, a variable resistance layer 109, and a third electrode 111.

The first electrode 103 may be a layer for connection of the first line 101 and the memory cell, and may have a single layer structure or a multiple layer structure including a low-resistance conductive material, for example, a metal or a metal nitride.

The switching layer 105 may have a threshold switching characteristic. As a result, the switching layer 105 blocks a current or hardly flows the current when a magnitude of a voltage supplied to the upper end and the lower end thereof is less than a predetermined threshold voltage and allows the current to flow rapidly when the magnitude of the voltage is greater than the threshold voltage, thereby controlling access to the variable resistance layer 109. The switching layer 105 may include a diode, an ovonic threshold switching (OTS) material such as a chalcogenide-based material, a mixed ionic electronic conducting (MIEC) material such as a metal-containing chalcogenide-based material, a metal insulator transition material such as $NbO_2$ or $VO_2$, a tunneling insulating material having a relatively wide band gap such as $SiO_2$ or $Al_2O_3$, or the like.

The second electrode 107 may be formed between the switching layer 105 and the variable resistance layer 109, and may electrically connect the switching layer 105 and the variable resistance layer 109 while physically separating the switching layer 105 and the variable resistance layer 109. The second electrode 107 may have a single layer structure or a multiple layer structure including a low-resistance conductive material, for example, a metal or a metal nitride.

The variable resistance layer 109 may store different data by having a variable resistance characteristic switching between different resistance states according to the voltage or the current supplied to the upper end and the lower end thereof. The variable resistance layer 109 may have a single layer structure exhibiting a variable resistance characteristic alone or a multiple layer structure exhibiting a variable resistance characteristic by a combination of two or more layers. As an example, the variable resistance layer 109 may include a phase change material that switches between an amorphous state and a crystalline state by Joule heat generated according to a current flowing therethrough. However, embodiments of the present disclosure are not limited thereto, and the variable resistance layer 109 may include a single layer structure or a multiple layer structure including a material used for an RRAM, a PRAM, an MRAM, an FRAM, or the like, for example, a metal oxide such as a perovskite-based oxide or a transition metal oxide, a phase change material such as a chalcogenide-based compound, a ferroelectric material, a ferromagnetic material, or the like. Even in a case where the variable resistance layer 109 does not include a phase change material, the variable resistance layer 109 may be applied when heat transfer between memory cells is required to be blocked/reduced.

The third electrode 111 may be disposed on the uppermost portion of the stack pattern to provide a connection of the memory cell and the second line 113 of FIG. 5B, which will be described later, and may have a single layer structure or a multiple layer structure including a low-resistance conductive material, for example, a metal or a metal nitride.

The layer structure of the stack patterns 103, 105, 107, 109, and 111 may be variously modified. As an example, the stack pattern may further include one or more layers for a data storage characteristic, process improvement, and the like, in addition to the layers 103, 105, 107, 109, and 111. Alternatively, at least one of the plurality of layers 103, 105, 107, 109, and 111 included in the stack pattern may be omitted. Alternatively, positions of the switching layer 105 and the variable resistance layer 109 may be reversed in the vertical direction.

Figure 4A:
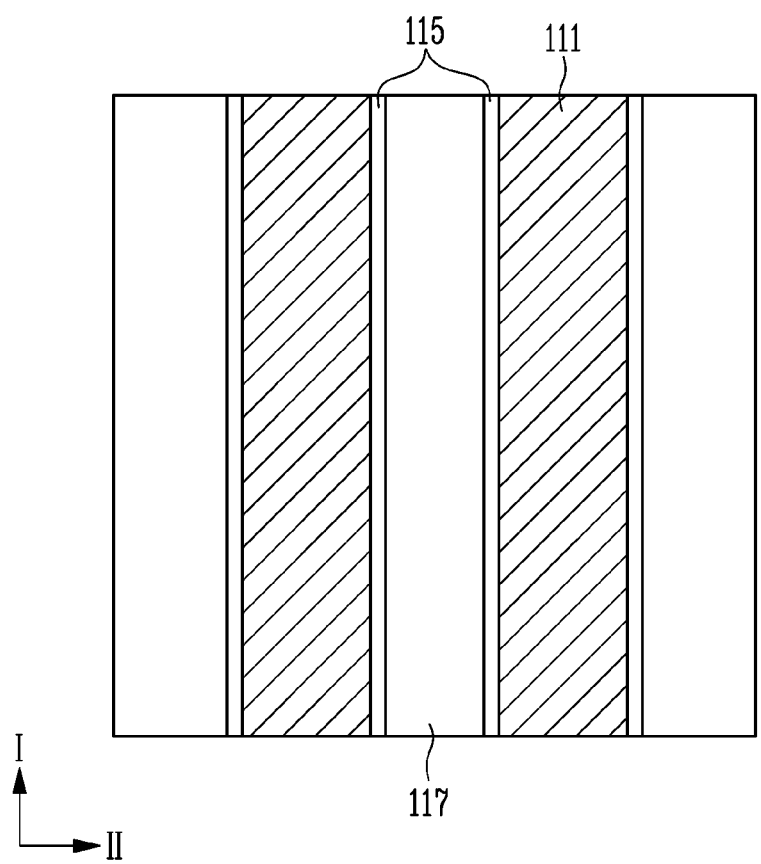
Figure 4B:
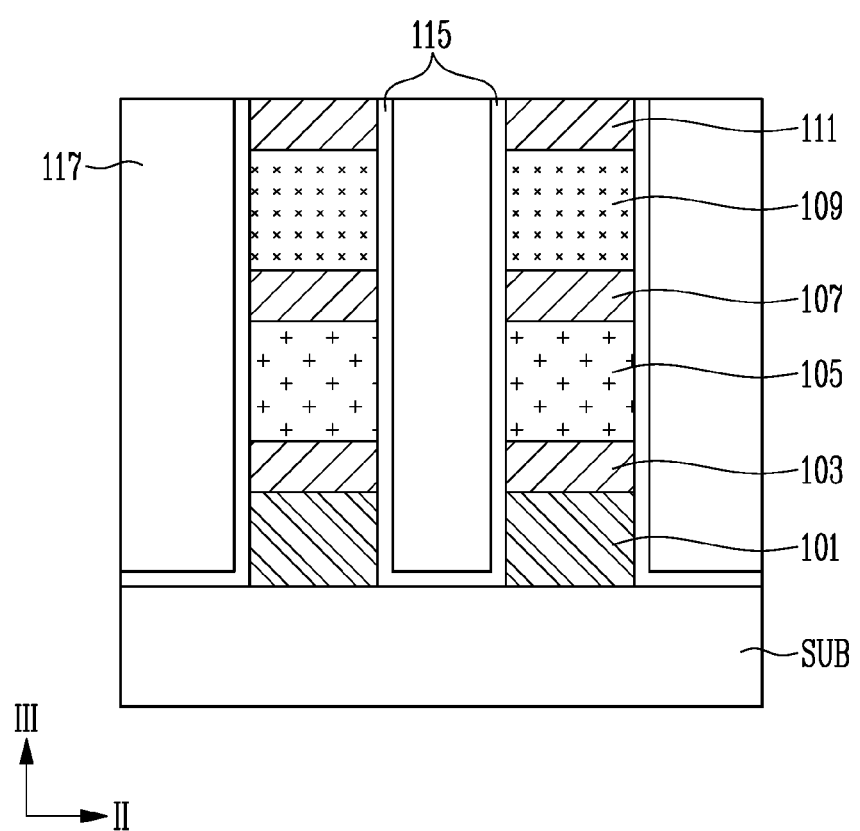

FIG. 4A is a layout diagram of a semiconductor memory, and FIG. 4B is a cross-sectional view taken in the second direction II in FIG. 4A.

Referring to FIGS. 4A and 4B, a first protective layer 115 may be formed along exposed sidewalls of the stack patterns 103, 105, 107, 109, and 111 and an exposed surface of the substrate SUB. The first protective layer 115 may be formed to have a thin thickness that does not completely fill a space between the plurality of stack patterns 103, 105, 107, 109, and 111 in the second direction II. The space between the plurality of stack patterns 103, 105, 107, 109, and 111 may be filled with a first insulating layer 117.

For example, the first protective layer 115 is formed along exposed surfaces of the plurality of stack patterns 103, 105, 107, 109, and 111 and the exposed surface of the substrate SUB. Thereafter, the first insulating layer 117 is formed on the entire structure to substantially completely fill the space between the plurality of stack patterns 103, 105, 107, 109, and 111. Thereafter, a chemical mechanical polishing (CMP) process may be performed to expose an upper surface of the third electrode 111. Accordingly, the first protective layer 115 may remain on the sidewalls of the plurality of stack patterns 103, 105, 107, 109, and 111, and the first insulating layer 117 may remain in the space between the plurality of stack patterns 103, 105, 107, 109, and 111.

The first protective layer 115 may function to protect the stack patterns 103, 105, 107, 109, and 111 serving as the memory cell in a subsequent process. For example, the first protective layer 115 may include silicon nitride containing silicon and nitrogen to substantially prevent oxidation of the stack patterns 103, 105, 107, 109, and 111 during a process of forming the first insulating layer 117, in which the space between the stack patterns 103, 105, 107, 109, and 111 are filled with an insulating material. The silicon nitride may further include another element in addition to silicon and nitrogen. For example, the first protective layer 115 may include SiN, SiCN, or the like. The first protective layer 115 may have a single layer structure or a multilayer structure including various insulating materials.

The first insulating layer 117 may form an insulating material in a thickness at which the space between the plurality of stack patterns 103, 105, 107, 109, and 111 are sufficiently filled. An upper surface of the first insulating layer 117 may be flattened by a planarization process (CMP). When an aspect ratio of a space between the first protective layers 115 is relatively large, the first insulating layer 117 may be formed of a superfluid material to facilitate filling the space. When the first insulating layer 117 is formed of the superfluid material, a curing process may be performed as a subsequent process. The first insulating layer 117 may include a material having relatively low thermal conductivity, that is, a low-K material in order to reduce heat loss from the variable resistance layer 109 or heat transfer between neighboring variable resistance layers 109. For example, the first insulating layer 117 may include an SiOC material, and in addition, the first insulating layer 117 may further include an impurity such as hydrogen (H) and nitrogen (N). The thermal conductivity of the first insulating layer 117 may be lower than that of the first protective layer 115.

Figure 5A:
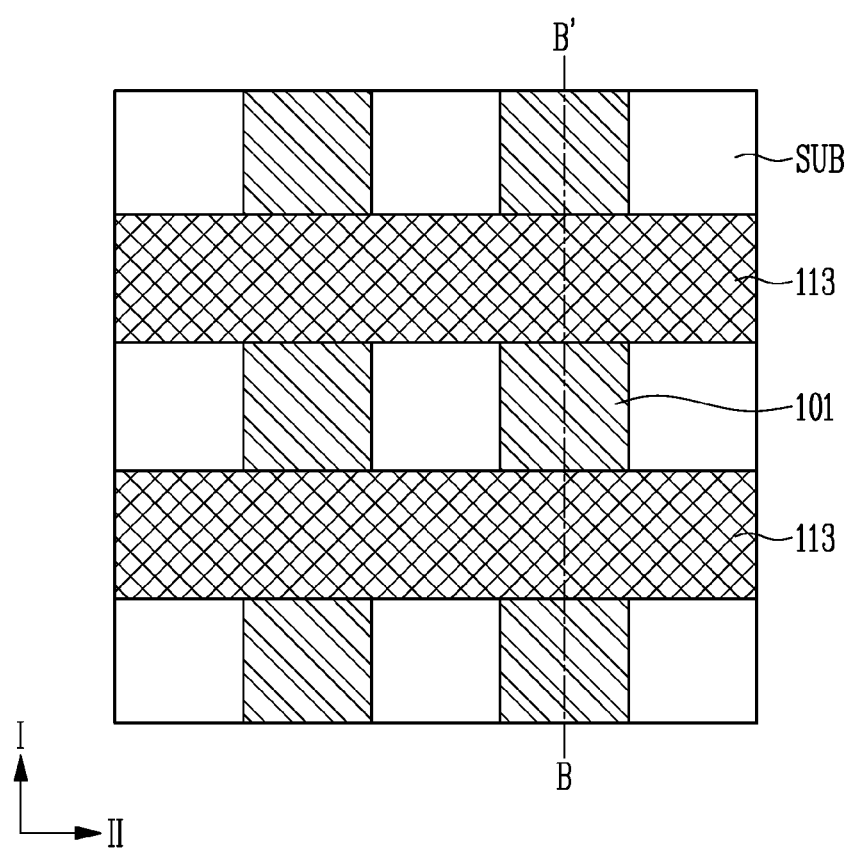
Figure 5B:
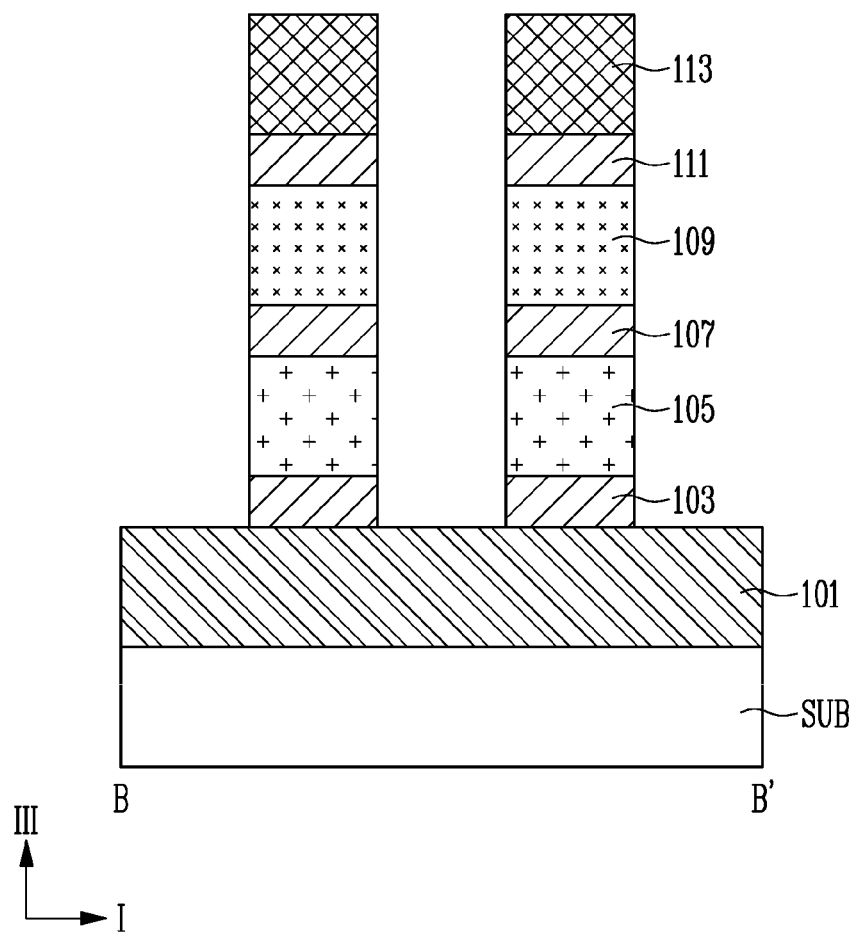

FIG. 5A is a layout diagram of a semiconductor memory, and FIG. 5B is a cross-sectional view obtained by cutting a line B-B' in the first direction I in FIG. 5A.

Referring to FIGS. 5A and 5B, a second line conductive layer is formed on the entire structure including the first insulating layer 117, and an etching process using a mask pattern extending in the second direction II is performed to form patterned second line 113 and stack patterns 103, 105, 107, 109, and 111. Accordingly, the second line 113 may be formed in a line shape extending in the second direction II, and the stack patterns 103, 105, 107, 109, and 111 may be formed in a quadrangular column shape. The stack patterns 103, 105, 107, 109, and 111 patterned in the quadrangular column shape may be defined as the memory cell. The memory cells may have an island shape and may be arranged in a matrix form along the first direction I and the second direction II. At this time, the first protective layer 115 is separated from each other in the first direction I and the second direction II.

An extension direction (e.g., the second direction II) of the second line 113 and an extension direction (e.g., the first direction I) of the first line 101 may vertically cross each other.

During the etching process for patterning the stack patterns 103, 105, 107, 109, and 111, the first protective layer 115 and the first insulating layer 117 disposed under a space between the second lines 113 may also be etched.

The second line 113 may be connected to the third electrode 111 positioned on an upper end of the stack pattern to transmit a current or a voltage to the memory cell, and may have a single layer structure or a multiple layer structure including various conductive materials such as a metal and a metal nitride. When the first line 101 functions as a local line (or a row line), the second line 113 may function as the column line, when the first line 101 functions as the word line, the second line 113 may function as the bit line, and when the first line 101 functions as the bit line, the second line 113 may function as the word line.

The stack patterns 103, 105, 107, 109, and 111 corresponding to the memory cell may be disposed at an intersection region of the first line 101 and the second line 113.

Figure 6A:
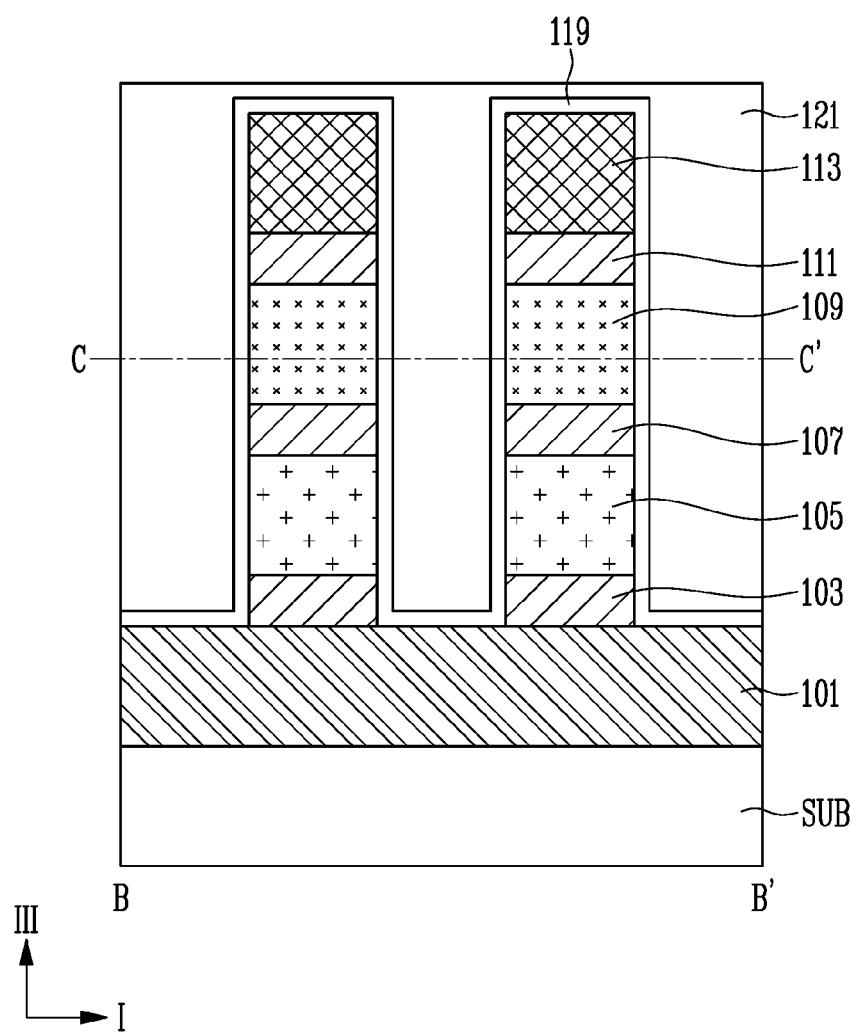
Figure 6B:
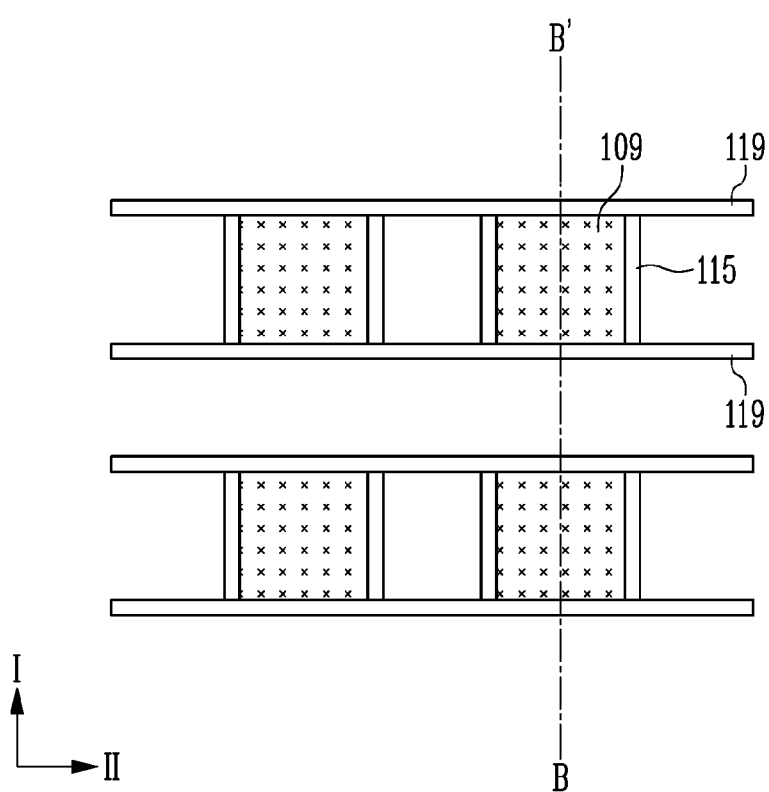

FIG. 6A is a cross-sectional view of the semiconductor memory in the second direction II, and FIG. 6B is a layout diagram of FIG. 6A. Specifically, FIG. 6A is a cross-sectional view obtained by cutting the line B-B' of FIG. 6B.

Referring to FIGS. 6A and 6B, a second protective layer 119 may be formed along the entire surface of the process result of FIGS. 5A and 5B. That is, the second protective layer 119 may be formed along the sidewalls of the stack patterns 103, 105, 107, 109, and 111, and along a sidewall and an upper surface of the second line 113. Accordingly, facing first and second sidewalls of the stack patterns 103, 105, 107, 109, and 111 are in contact with the first protective layer 115, and facing third and fourth sidewalls of the stack patterns 103, 105, 107, 109, and 111 are in contact with the second protective layer 119. Thereafter, a second insulating layer 121 filling a space between the second protective layers 119 in the first direction I may be formed.

Similarly to the first protective layer 115, the second protective layer 119 may function to protect the memory cell in a subsequent process. As an example, the second protective layer 119 may include silicon nitride containing silicon and nitrogen to substantially prevent oxidation of the memory cell in the process of forming an insulating material filling a space between the memory cells in the first direction I. The silicon nitride may further include another element in addition to silicon and nitrogen. For example, the second protective layer 119 may include SiN, SiCN, or the like. The second protective layer 119 may have a single layer structure or a multilayer structure including various insulating materials. The second protective layer 119 may be formed of the same material as the first protective layer 115. The second protective layer 119 may be formed to have substantially the same thickness as the first protective layer 115. For example, an absolute difference between a thickness of the first protective layer 115 and a thickness of the second protective layer 119 may not exceed 0.5%, 1%, 3%, or 5% of a smaller one of the thicknesses of the first and second protective layers 115 and 119.

The second insulating layer 121 may form an insulating material in a thickness at which a space between the plurality of stack patterns 103, 105, 107, 109, and 111 and the second line 113 is sufficiently filled. The upper surface of the second insulating layer 121 may be flattened by a planarization process (CMP). When an aspect ratio of the space between the second protective layers 119 is relatively large, the second insulating layer 121 may be formed of a superfluid material to facilitate filling the space. When the second insulating layer 121 is formed of the superfluid material, a curing process may be performed as a subsequent process. The second insulating layer 121 may include a material having relatively low thermal conductivity, that is, a low-K material, in order to reduce heat loss from the variable resistance layer 109 or heat transfer between neighboring variable resistance layers 109. For example, the second insulating layer 121 may include a SiOC material, and in addition, the second insulating layer 121 may further include an impurity such as hydrogen (H) and nitrogen (N). The thermal conductivity of the second insulating layer 121 may be lower than that of the second protective layer 119. The second insulating layer 121 may be formed of the same material as the first insulating layer 117.

Figure 7:
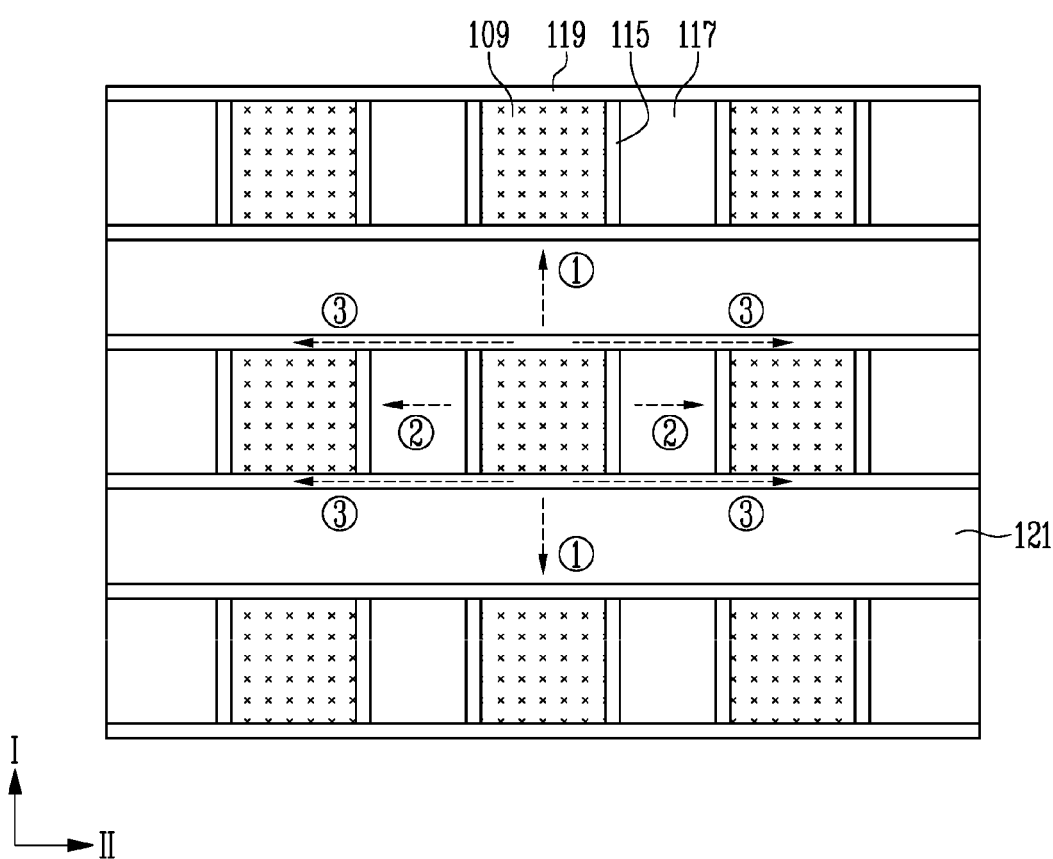

FIG. 7 is a layout diagram illustrating heat loss/transfer from a memory cell, in particular, the variable resistance layer 109 to a periphery during an operation of the semiconductor memory in which a process corresponding to FIGS. 6A and 6B is completed.

Referring to FIG. 7, it is assumed that a resistance state of a central variable resistance layer 109 disposed in a center among nine variable resistance layers 109 arranged in a 3*3 matrix shape is changed, and thus heat generated from the central variable resistance layer 109 is transferred. At this time, a heat loss path from the central variable resistance layer 109 or a heat transfer path to the adjacent variable resistance layers 109 in the first direction I is indicated by an arrow ①. In addition, a heat loss path from the central variable resistance layer 109 or a heat transfer path to the adjacent variable resistance layer 109 in the second direction II is indicated by arrows ② and ③. Referring to the arrow ①, the path of the heat loss/heat transfer in the first direction I may pass through the second protective layer 119 and the second insulating layer 121. On the other hand, in the second direction II, the path of the heat loss/heat transfer may pass through not only the first protective layer 115 and the first insulation layer 117 as shown by the arrow ② but also the second protective layer 119 as shown by the arrow ③. This is because the second protective layer 119 is disposed on both sidewalls of the memory cell in the first direction I and extends in the second direction II. The heat loss/heat transfer paths indicated by the arrows ① and ② may be effectively blocked because the first insulating layer 117 and the second insulating layer 121 have low thermal conductivity. On the other hand, a block of the heat loss/heat transfer path indicated by the arrow ③ is difficult. Accordingly, a heat loss/heat transfer degree in the second direction II may be greater than a heat loss/heat transfer degree in the first direction I. Therefore, reducing the overall heat loss/heat transfer degree by reducing the heat loss/heat transfer degree in the second direction II to a degree similar to the heat loss/heat transfer degree in the first direction I is required. In other words, the second protective layer 119, which has a thermal conductivity higher than that of each of the first and second insulation layers 117 and 121, may be formed to continuously extend in the second direction II and contact sidewalls of memory cells, these sidewalls being substantially aligned in the second direction II, thereby providing a thermal path indicated by the arrow ③ through which a relatively large amount of heat can be transferred compared to other thermal paths indicated by the arrows ① and ②. Due to the thermal path indicated by the arrow ③, heat generated in the memory cell including the central variable resistance layer 109 may not be effectively blocked in the second direction II, leading to thermal disturbance to adjacent memory cells. In addition, a temperature distribution in the second direction II may be significantly different from that in the first direction I. To this end, a process to be described later may be additionally performed.

Figure 8A:
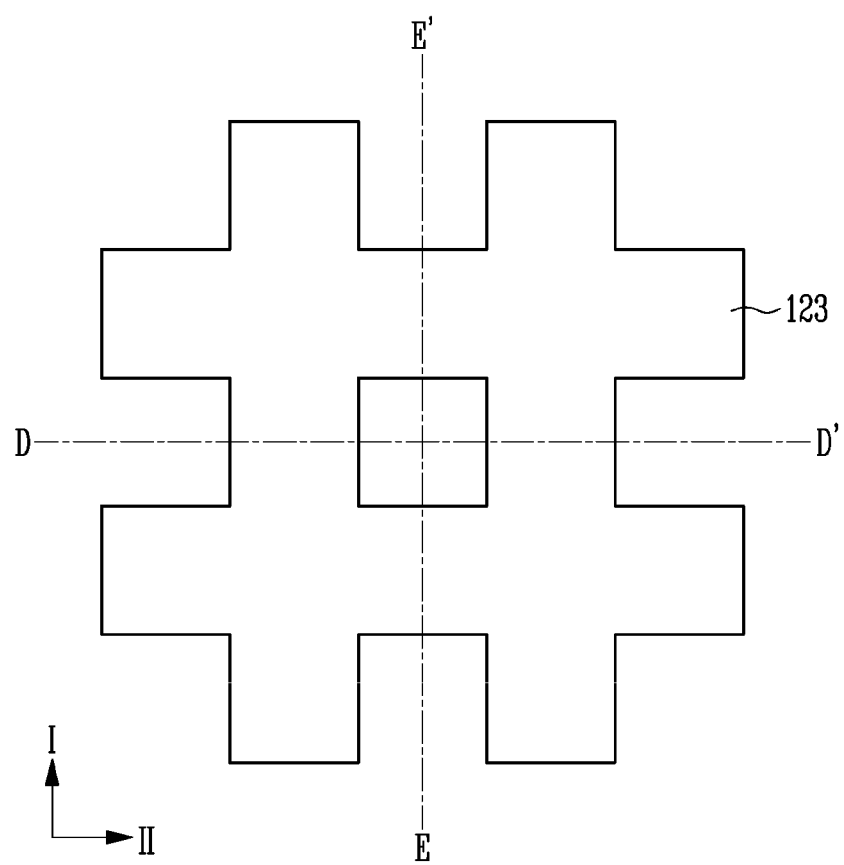
Figure 8C:
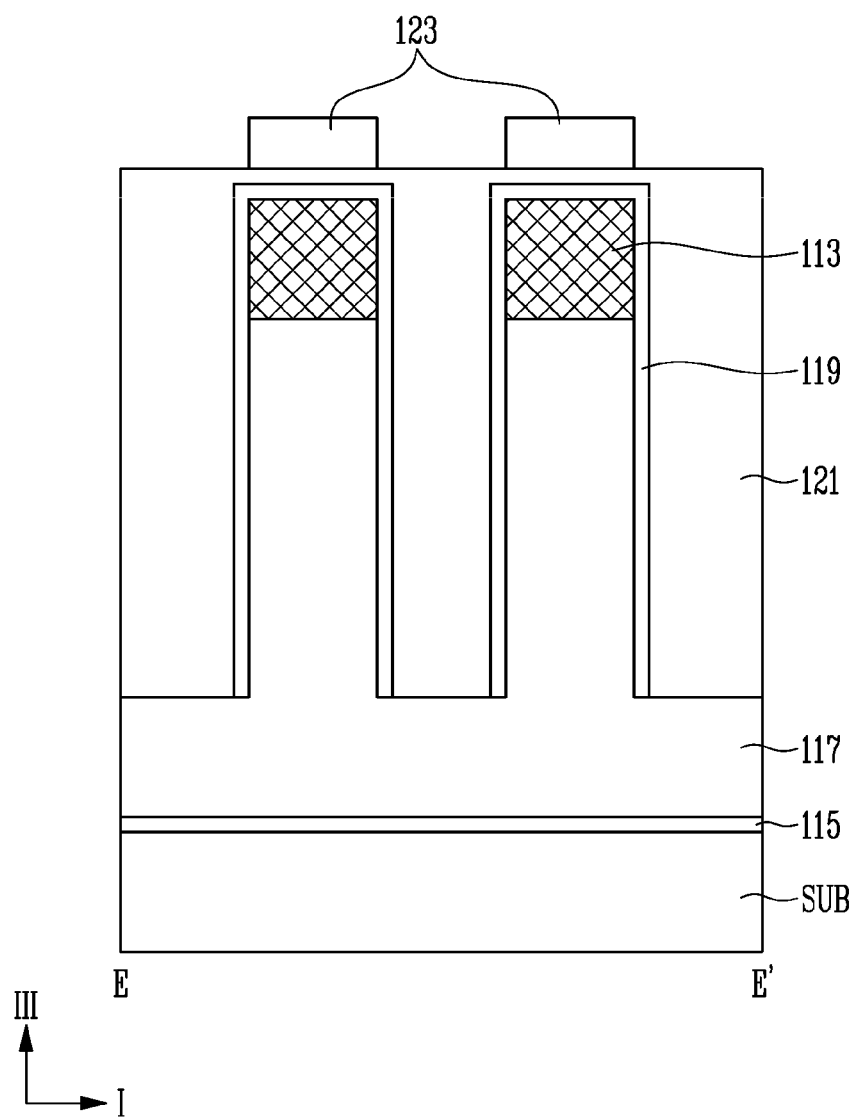

FIG. 8A is a layout diagram of a semiconductor memory, FIG. 8B is a cross-sectional view taken along a line D-D' in the second direction II of FIG. 8A, and FIG. 8C is a cross-sectional view taken along line E-E' in the first direction I of FIG. 8A.

Referring to FIGS. 8A, 8B, and 8C, a hard mask pattern 123 is formed, so that a space between the stack patterns 103, 105, 107, 109, and 111 disposed diagonally adjacent to each other is formed on an upper portion of the semiconductor memory of which the process of FIGS. 6A and 6B is completed. A plurality of open regions of the hard mask pattern 123 may be arranged in a matrix form. The open region of the hard mask pattern 123 may overlap the second protective layer 119 formed in a space between the stack patterns 103, 105, 107, 109, and 111 adjacent in the second direction II among the second protective layers 119 extending in the second direction II. For example, when a second protective layer 119 extends in the second direction II, a portion of the second protective layer 119 between an adjacent pair of stacked patterns 103, 105, 107, 109, and 111 in the second direction II may be exposed by a corresponding open region among the plurality of open regions of the hard mask pattern 123. The hard mask pattern 123 may overlap the first line 101 and the second line 113. The hard mask pattern 123 may overlap the stack patterns 103, 105, 107, 109, and 111. The hard mask pattern 123 may overlap the first protective layer 115 and the second protective layer 119 formed on the sidewalls of the stack patterns 103, 105, 107, 109, and 111.

Figure 9A:
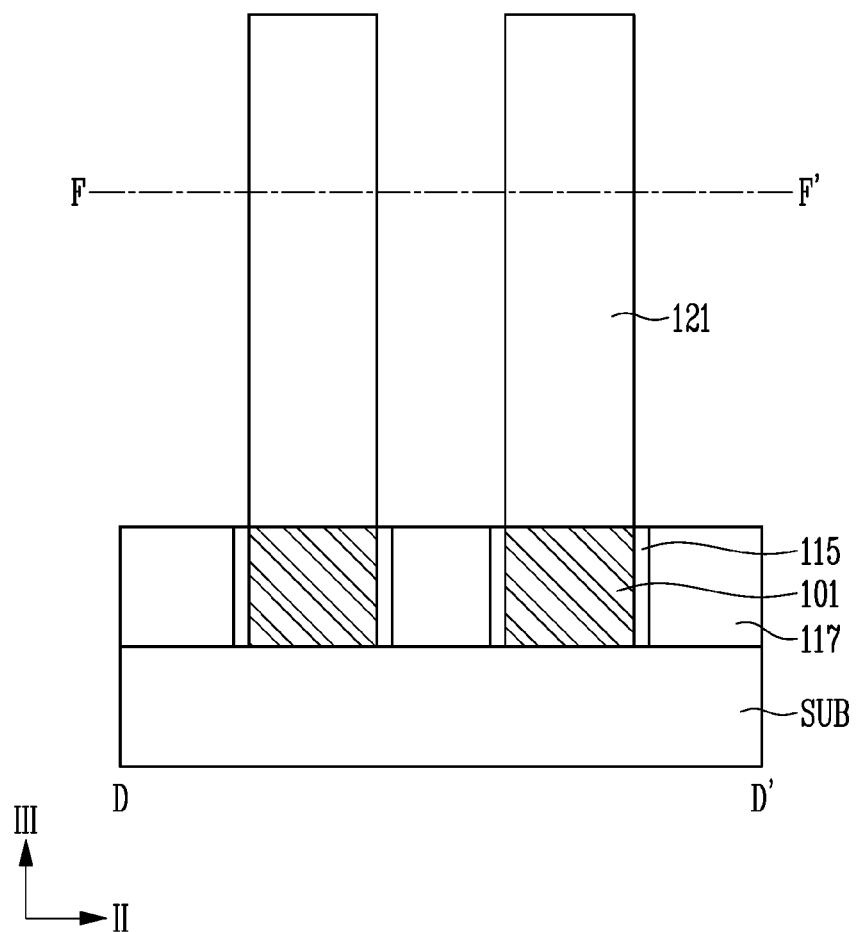

FIG. 9A is a cross-sectional view of the semiconductor memory in the second direction II, and FIG. 9B is a cross-sectional view of the semiconductor memory in the first direction I.

Referring to FIGS. 9A and 9B, the second insulating layer 121 and the second protective layer 119 may be removed by etching the second insulating layer 121 and the second protective layer 119 formed in the space between the stack patterns 103, 105, 107, 109, and 111 adjacent in the second direction II among the second protective layers 119 extending in the second direction II, by performing an etching process using the hard mask pattern 123 of FIGS. 8A and 8B described above. That is, a portion of the second protective layer 119 extending in the second direction II that does not overlap the first line 101 is removed by etching the portion. Specifically, a portion of the second protective layer 119, which is disposed between an adjacent pair of stacked patterns 103, 105, 107, 109, and 111 in the second direction II without overlapping a corresponding first line 101 as well as a corresponding second line 113 and exposed by a corresponding open region of the hard mask pattern 123, may be removed by etching the portion. The etching process may be performed to expose the first insulating layer 117.

Figure 10:
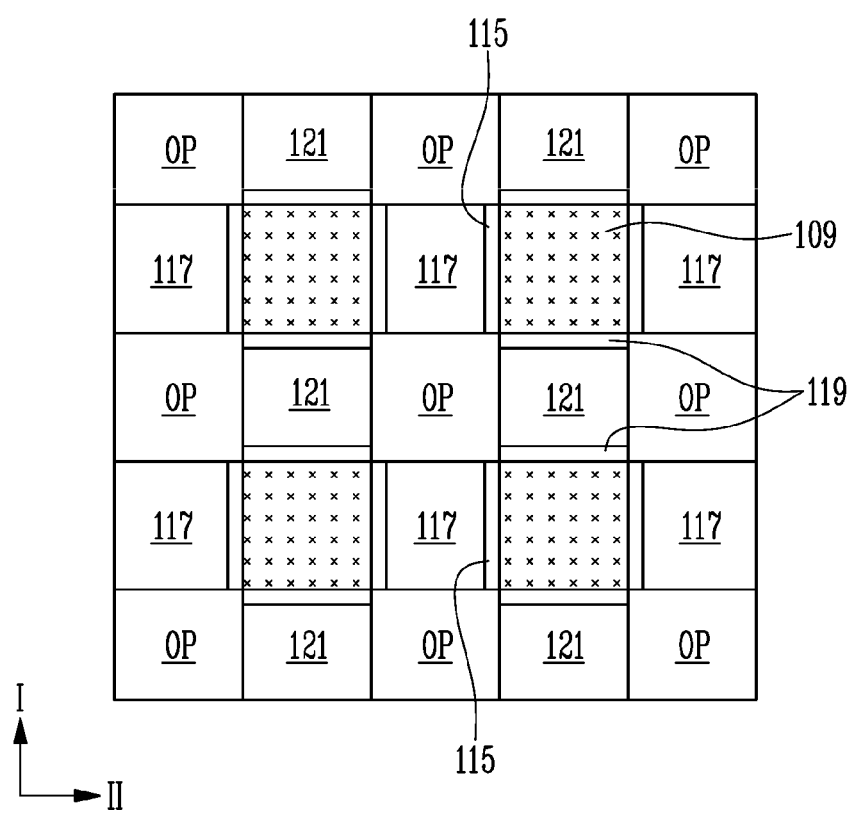

FIG. 10 is a cross-sectional view of an F-F' plane in the structure resulting from completion of the process of FIGS. 9A and 9B. The F-F' plane may be a plane on which the variable resistance layer 109 is disposed.

Referring to FIG. 10, the second protective layer 119 formed in an etched space OP between the stack patterns adjacent in the second direction II is removed among the second protective layers 119 extending in the second direction II. That is, for each of the plurality of stack patterns, the first protective layer 115 and the second protective layer 119 remain on the first sidewall and the second sidewall facing each other, and the third sidewall and the fourth sidewall facing each other. In particular, for each of the variable resistance layers 109, the first protective layer 115 and the second protective layer 119 are disposed on the first sidewall and the second sidewall facing each other, and the third sidewall and the fourth sidewall facing each other. For example, the first protective layers 115 may be respectively disposed on the first and second sidewalls facing each other and being arranged in the second direction II, and the second protective layers 119 may be respectively disposed on the third and fourth sidewalls facing each other and being arranged in the first direction I. In addition, the first protective layer 115 and the second protective layer 119 are formed so as not to contact each other at a corner portion of each of the variable resistance layers 109. In other words, the first protective layer 115 and the second protective layer 119 may be formed adjacent to each other at a corner of each of the variable resistance layers 109 without wrapping around the corner. In addition, a plurality of first protective layers 115 may be substantially aligned in the first direction I and partially surround a sidewall of the second line 113 that extends in the first direction I. For example, these first protective layers 115 may be disposed to cover respective portions of the sidewall of the second line 113.

Thereafter, a process of filling the etched space OP with a third insulating layer may be additionally performed. The third insulating layer may include the same material as the first insulating layer 117 or the second insulating layer 121.

Accordingly, transfer of heat generated in the variable resistance layer 109 to the variable resistance layer 109 adjacent in the second direction II through the second protective layer 119 during the operation of the semiconductor memory may be suppressed. Specifically, as shown in the embodiment of FIG. 10, a plurality of portions of the second protective layer 119 may be aligned in the second direction II and spaced apart from each other by the third insulating layer, similarly to a plurality of portions of the first protective layer 115 aligned in the first direction I. As a result, heat transferred from the variable resistance layer 109 in the second direction II may be more effectively blocked, compared to when the second protective layer 119 is formed to continuously extend in the second direction II as shown in FIG. 7, thereby substantially preventing an occurrence of thermal disturbance to adjacent memory cells.

In addition, the second protective layer 119 is formed to cover only a portion of a sidewall of the second line 113 of FIG. 9B. For example, the second protective layer 119 remains on a sidewall of a first region corresponding to an upper portion of the stack patterns 103, 105, 107, 109, and 111 of the second line 113, and the second protective layer 119 is etched and removed on a sidewall of a second region corresponding to the space between the stack patterns 103, 105, 107, 109, and 111 of the second line 113.

FIGS. 11A, 11B, 11C, 12A, 12B, and 13 are diagrams illustrating a method of manufacturing an electronic device according to another embodiment of the present disclosure.

Another embodiment of the present disclosure relates to a process step after FIGS. 3A to 6B described above.

Figure 11A:
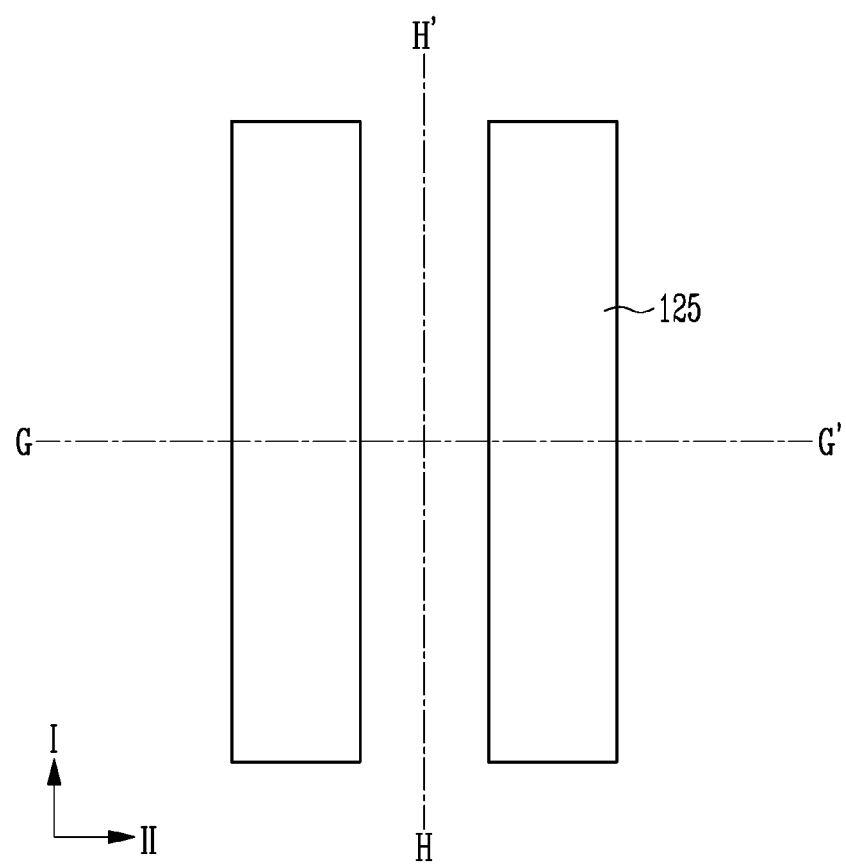
FIGS. 11A, 11B, 11C, 12A, 12B, and 13 are diagrams illustrating a method of manufacturing an electronic device according to another embodiment of the present disclosure.
Figure 11B:
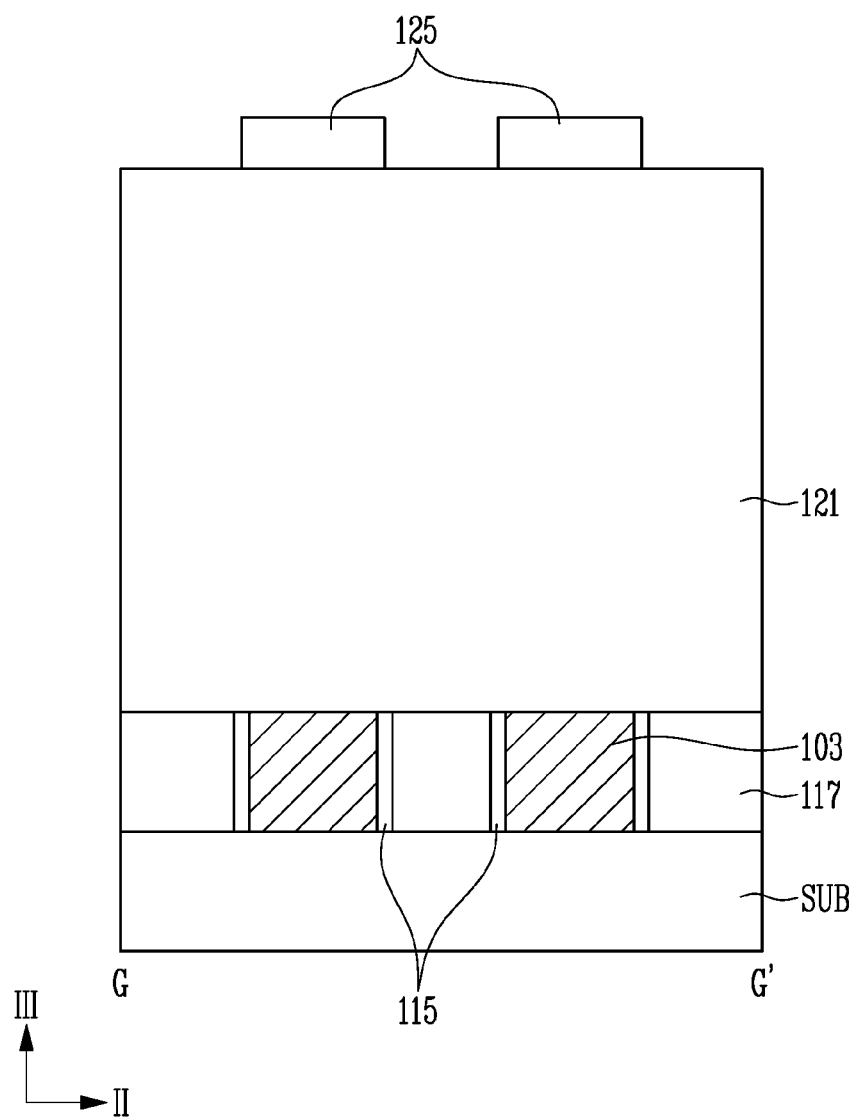
Figure 11C:
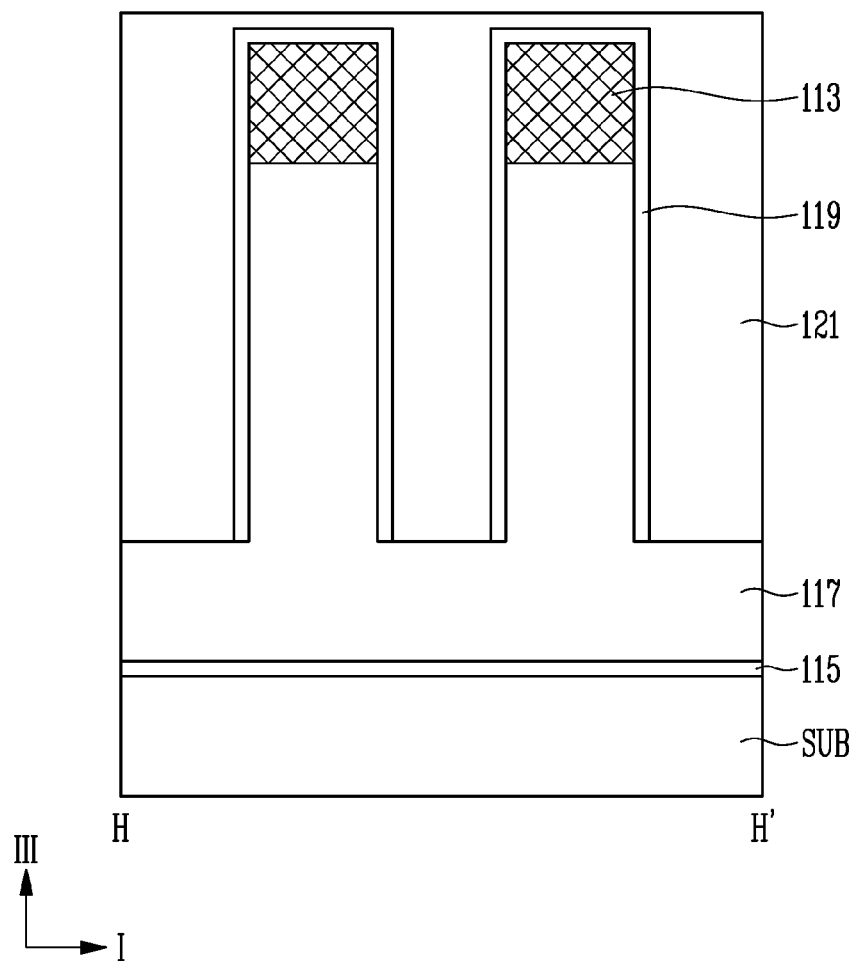

FIG. 11A is a layout diagram of the semiconductor memory, FIG. 11B is a cross-sectional view obtained by cutting a line G-G' in the second direction II of FIG. 11A, and FIG. 11C is a cross-sectional view obtained by cutting a line H-H' in the first direction I of FIG. 11A.

Referring to FIGS. 11A to 11C, a hard mask pattern 125 extending in the first direction I is formed on the structure resulting from completion of the process step related to FIGS. 6A and 6B. The hard mask pattern 125 may cross the second line in a vertical direction. The hard mask pattern 125 may be formed to expose the space between the plurality of stack patterns disposed adjacent to each other in the second direction II. That is, the hard mask pattern 125 may overlap the second protective layer 119 in some thicknesses, which is disposed between the plurality of variable resistance layers 109 disposed adjacent to each other in the second direction II. In addition, the hard mask pattern 125 may overlap the first protective layers 115 disposed between the plurality of variable resistance layers 109 adjacent in the second direction II. It is preferable that a critical dimension of the hard mask pattern 125 is designed to be greater than a critical dimension in the second direction II of the stack pattern so that a sidewall of the variable resistance layer 109 is not exposed due to removal of the first protective layer 115 formed on the sidewall of the stack pattern during the etching process. For example, during the etching process, the first protective layer 115 formed on the sidewall of the stack pattern may be partially etched in thickness, and thus the sidewall of the variable resistance layer 109 is not exposed.

Figure 12A:
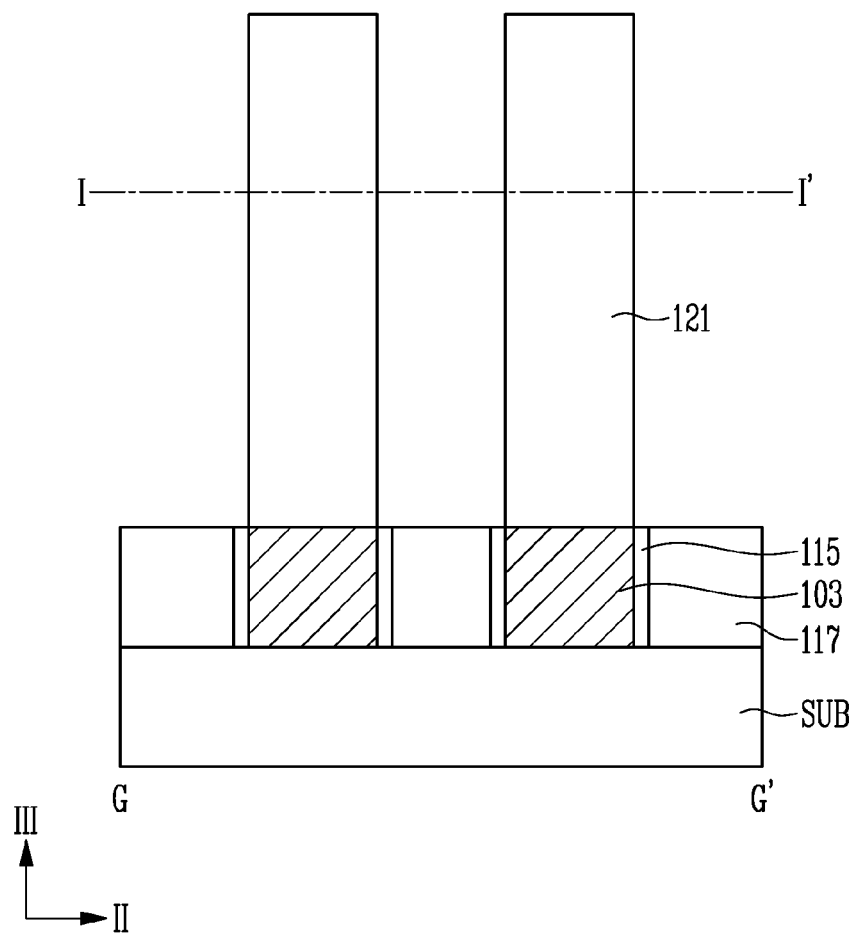
Figure 12B:
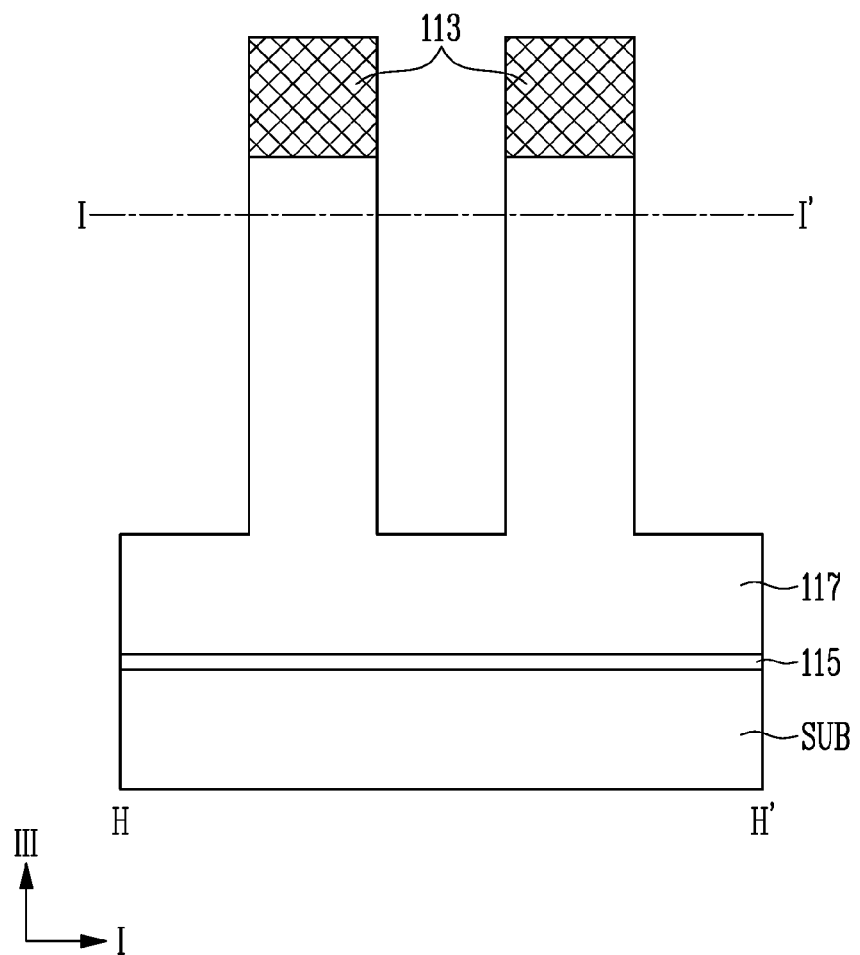

FIG. 12A is a cross-sectional view of the semiconductor memory in the second direction II, and FIG. 12B is a cross-sectional view of the semiconductor memory in the first direction I.

Referring to FIGS. 12A and 12B, the second insulating layer 121 and the second protective layer 119 formed in the space between the stack patterns adjacent in the second direction may be etched and removed among the second protective layers 119 extending in the second direction II, by performing an etching process using the hard mask pattern 125 and the second line 113 of FIGS. 11A and 11B as an etch mask. The etching process may be performed to expose the first insulating layer 117. At this time, the first protective layer 115 formed in the space between the stack patterns adjacent in the second direction II may be partially etched.

Figure 13:
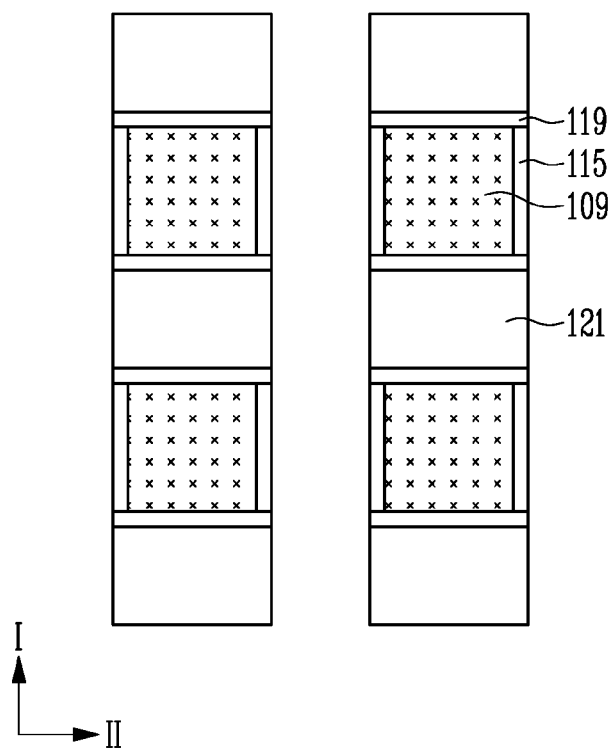

FIG. 13 is a cross-sectional view of an I-I' plane in the structure resulting from completion of the process of FIGS. 12A and 12B. The I-I' plane may be a plane on which the variable resistance layer 109 is disposed.

Referring to FIG. 13, the second protective layer 119 formed in the space between the stack patterns adjacent in the second direction II is substantially removed among the second protective layers 119 extending in the second direction II. That is, for each of the plurality of stack patterns, the first protective layer 115 and the second protective layer 119 remain on the first sidewall and the second sidewall facing each other, and the third sidewall and the fourth sidewall facing each other. In particular, for each of the variable resistance layers 109, the first protective layer 115 and the second protective layer 119 are disposed on the first sidewall and the second sidewall facing each other, and the third sidewall and the fourth sidewall facing each other. Specifically, the first protective layers 115 may be respectively disposed on the first and second sidewalls facing each other and being arranged in the second direction II, and the second protective layers 119 may be respectively disposed on the third and fourth sidewalls facing each other and being arranged in the first direction I. In addition, an end of the first protective layer 115 may contact an end portion of the second protective layer 119 so as to wrap around a corresponding corner of each of the variable resistance layers 109. Thereafter, a process of filling the etched space with the third insulating layer may be additionally performed. The third insulating layer may include the same material as the first insulating layer 117 or the second insulating layer 121.

Accordingly, the transfer of heat generated in the variable resistance layer 109 to the variable resistance layer 109 adjacent in the second direction through the second protective layer 119 during the operation of the semiconductor memory may be suppressed. Similarly to the embodiment of FIG. 10, heat transferred from the variable resistance layer 109 in the second direction II may be more effectively blocked, compared to when the second protective layer 119 is formed to continuously extend in the second direction II as shown in FIG. 7, thereby substantially preventing an occurrence of thermal disturbance to adjacent memory cells.

Figure 14:
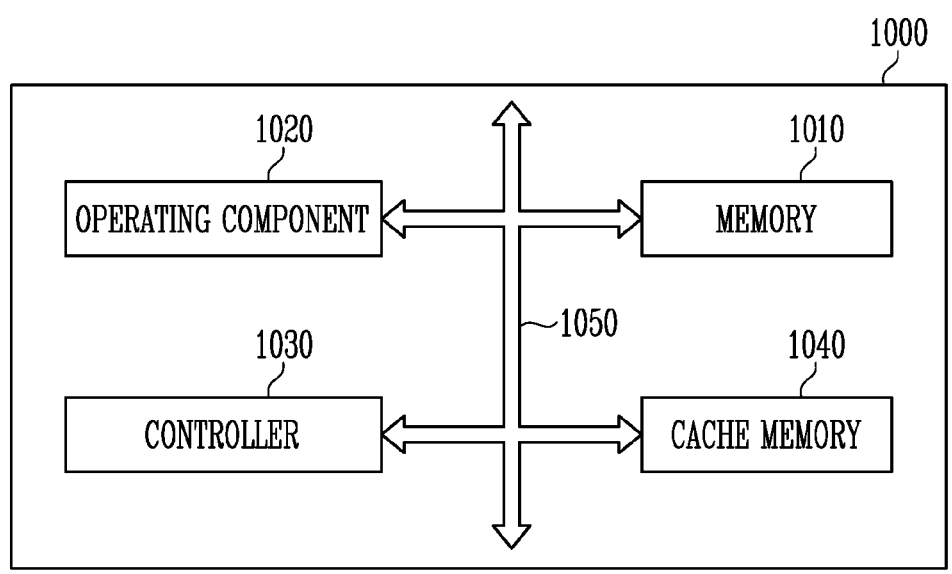
FIG. 14 is a configuration diagram of a microprocessor implementing a memory device according to an embodiment of the present disclosure.

FIG. 14 is a configuration diagram of a microprocessor implementing a memory device according to an embodiment of the present disclosure.

Referring to FIG. 14, the microprocessor 1000 may control and adjust a series of processes of receiving data from various external devices, processing the data, and transmitting a result of the process to the external device, and may include a memory 1010, an operating component 1020, a controller 1030, and the like. The microprocessor 1000 may be various data processing devices such as a central processing unit (CPU), a graphic processing unit (GPU), and a digital signal processor (DSP), an application processor.

The memory 1010 may be a processor register, a register, or the like, may store data in the microprocessor 1000, may include a data register, an address register, a floating point register, and the like, and may further include various registers. The memory 1010 may temporarily store addresses at which data for performing an operation in the operating component 1020, data of a result of the performance, and data for the performance are stored.

The memory 1010 may include one or more embodiments of the electronic device described above.

The operating component 1020 may perform various arithmetic operations or logical operations according to a result obtained by decoding an instruction by the controller 1030. The operating component 1020 may include one or more arithmetic and logic units (ALUs) and the like.

The controller 1030 may receive a signal from the memory 1010, the operating component 1020, and an external device of the microprocessor 1000, perform extraction or decoding of an instruction and control of a signal input/output of the microprocessor 1000, and the like, and execute a process indicated by a program.

The microprocessor 1000 according to the present embodiment may further include a cache memory 1040 capable of temporarily storing data input from an external device or data to be output to an external device, in addition to the memory 1010. In this case, the cache memory 1040 may exchange data with the memory 1010, the operating component 1020, and the controller 1030 through a bus interface 1050.

Figure 15:
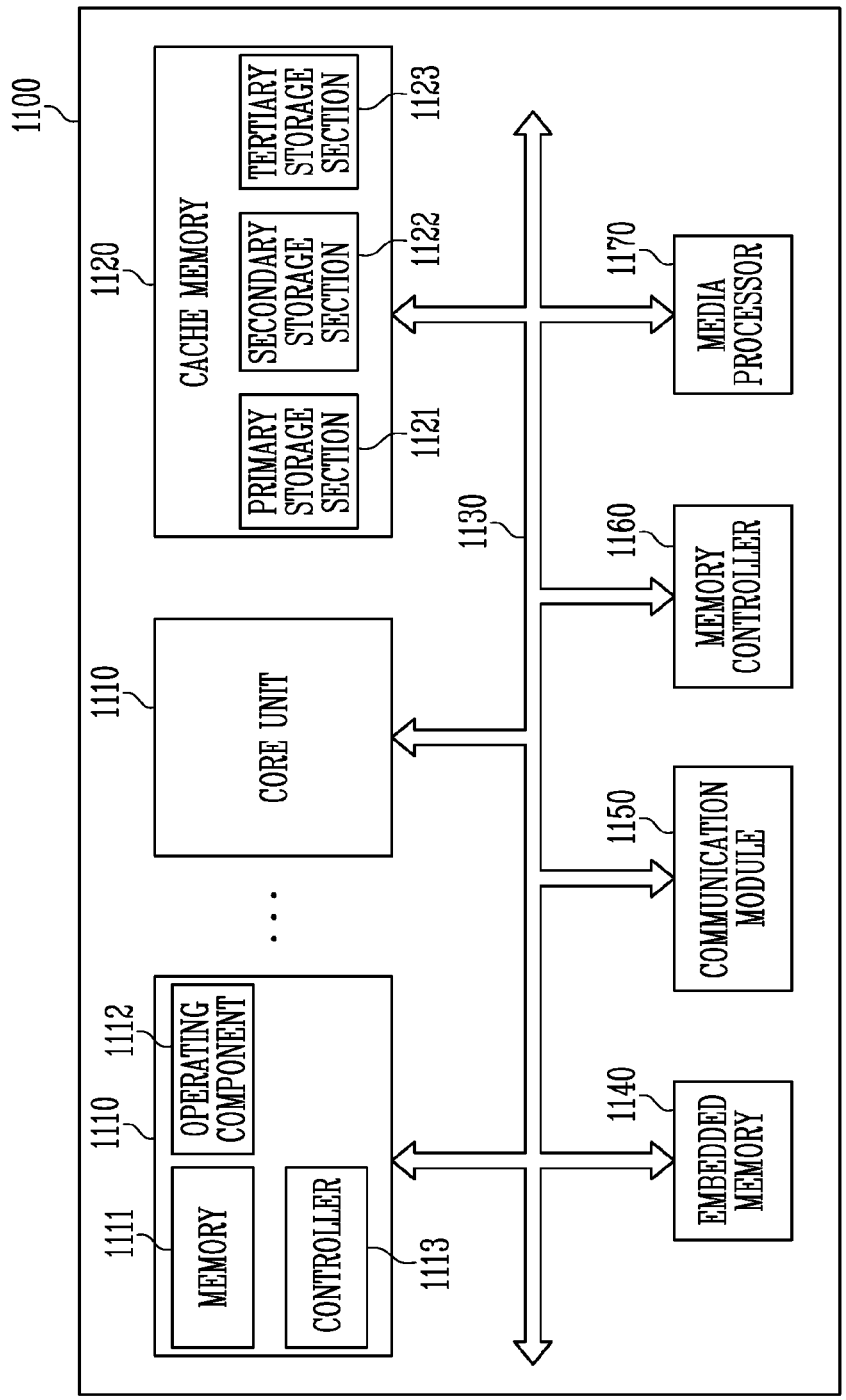
FIG. 15 is a configuration diagram of a processor implementing a memory device according to an embodiment of the present disclosure.

FIG. 15 is a configuration diagram of a processor implementing a memory device according to an embodiment of the present disclosure.

Referring to FIG. 15, the processor 1100 may include various functions in addition to the functions of a microprocessor for controlling and adjusting a series of processes of receiving data from various external devices, processing the data, and transmitting a result of the process to the external device, and thus performance improvement and multi-function may be implemented. The processor 1100 may include a core unit 1110 serving as a microprocessor, a cache memory 1120 temporarily store data, and a bus interface 1130 for transferring data between internal and external devices. The processor 1100 may include various system on chips (SoCs) such as a multi core processor, a graphic processing unit (GPU), and an application processor (AP).

The core unit 1110 of the present embodiment may be a part for performing an arithmetic logic operation on data input from an external device and may include a memory 1111, an operating component 1112, and a controller 1113.

The memory 1111 may be a processor register, a register, or the like, may store data in the processor 1100, may include a data register, an address register, a floating point register, and the like, and may further include various registers. The memory 1111 may temporarily store addresses at which data for performing an operation in the operating component 1112, data of a result of the performance, and data for the performance are stored. The operating component 1112 may be a part performing an operation in the processor 1100, and may perform various arithmetic operations, logical operations, and the like according to a result obtained by decoding an instruction by the controller 1113. The operating component 1112 may include one or more arithmetic and logic units (ALUs) and the like. The controller 1113 may receive a signal from an external device such as the memory 1111, the operating component 1112, and the processor 1100, perform extraction or decoding of an instruction, control of a signal input/output of the processor 1000, and the like, and execute a process indicated by a program.

The cache memory 1120 temporarily stores data to compensate for a data process speed difference between the core unit 1110 operating at a high speed and an external device operating at a low speed. The cache memory 1120 may include a primary storage 1121, a secondary storage 1122, and a tertiary storage 1123. In general, the cache memory 1120 includes the primary storage 1121 and the secondary storage 1122, and may include the tertiary storage 1123 when a high capacity is required. The cache memory 1120 may include more storages as needed. That is, the number of storages included in the cache memory 1120 may vary depending on design. Here, process speeds for storing and discriminating data in the primary, secondary, and tertiary storages 1121, 1122, and 1123 may be the same or different. When the process speeds of each storage are different, the speed of the primary storage may be the fastest. One or more of the primary storage 1121, the secondary storage 1122, and the tertiary storage 1123 of the cache memory 1120 may include one or more embodiments of the semiconductor device described above. For example, the cache memory 1120 may include a row line, a column line crossing the row line, and a memory cell positioned between the row line and the column line, and including a first carbon electrode material and a second carbon electrode material formed on a surface of the first carbon electrode material and having a thickness of 100 Å or less.

FIG. 15 shows a case where all of the primary, secondary, and tertiary storages 1121, 1122, and 1123 are configured in the cache memory 1120. However, all of the primary, secondary, and tertiary storages 1121, 1122, and 1123 may be configured outside the core unit 1110 and compensate for the process speed difference between the core unit 1110 and the external device. Alternatively, the primary storage 1121 of the cache memory 1120 may be positioned inside the core unit 1110, and the secondary storage 1122 and the tertiary storage 1123 may be configured outside the core unit 1110 and thus a function of compensating the process speed difference may be further strengthened. Alternatively, the primary and secondary storages 1121 and 1122 may be positioned inside the core unit 1110, and the tertiary storage 1123 may be positioned outside the core unit 1110.

The bus interface 1130 connects the core unit 1110, the cache memory 1120, and an external device so as to efficiently transmit data.

The processor 1100 according to the present embodiment may include a plurality of core units 1110 and the plurality of core units 1110 may share the cache memory 1120. The plurality of core units 1110 and the cache memory 1120 may be directly connected to each other or may be connected to each other through the bus interface 1130. All of the plurality of core units 1110 may be configured equally to the core unit described above. When the processor 1100 includes the plurality of core units 1110, the primary storage 1121 of the cache memory 1120 may be configured in the respective core units 1110 corresponding to the number of the plurality of core units 1110, and the secondary storage 1122 and the tertiary storage 1123 may be configured outside the plurality of core units 1110 to be shared through the bus interface 1130. Here, the process speed of the primary storage 1121 may be faster than the process speeds of the secondary and tertiary storages 1122 and 1123. In another embodiment, the primary storage 1121 and the secondary storage 1122 may be configured in the respective core units 1110 corresponding to the number of the plurality of core units 1110, and the tertiary storage 1123 may be configured outside the plurality of core units 1110 to be shared through the bus interface 1130.

The processor 1100 according to the present embodiment may include an embedded memory 1140 that stores data, a communication module 1150 that may transmit and receive data in a wired manner or wirelessly with an external device, a memory controller 1160 that drives an external storage device, a media processor 1170 that processes data processed by the processor 1100 and input from an external input device and outputs the processed data to an external interface device, and the like. In addition, the processor 1100 may further include a plurality of modules and devices. In this case, the plurality of added modules may exchange data with the core unit 1110 and the cache memory 1120 through the bus interface 1130.

Here, the embedded memory 1140 may include a nonvolatile memory as well as a volatile memory. The volatile memory may include a dynamic random access memory (DRAM), a mobile DRAM, a static random access memory (SRAM), a memory performing a function similar to that of these, and the like. The nonvolatile memory may include a read only memory (ROM), a NOR flash memory, a NAND flash memory, a phase change random access memory (PRAM), a resistive random access memory (RRAM), a spin transfer torque random access memory (STTRAM), a magnetic random access memory (MRAM), a memory performing a function similar to that of these, and the like.

The communication module 1150 may include a module capable of connecting with a wired network, a module capable of connecting with a wireless network, and both of the modules capable of connecting with a wired network and the module capable of connecting with a wireless network. A wired network module may include a local area network (LAN), a universal serial bus (USB), an Ethernet, a power line communication (PLC), or the like, as various devices that transmit and receive data through a transmission line. A wireless network module may include an infrared data association (IrDA), a code division multiple access (CDMA), a time division multiple access (TDMA), a frequency division multiple access (FDMA), a wireless LAN, Zigbee, a ubiquitous sensor network (USN), Bluetooth, radio frequency identification (RFID), long term evolution (LTE), near field communication (NFC), wireless broadband Internet (WIBRO), high speed downlink packet access (HSDPA), wideband CDMA (WCDMA), ultra wide band (UWB), and the like, as various devices that transmit and receive data without a transmission line.

The memory controller 1160 is for processing and managing data transmitted between the processor 1100 and an external storage device operating according to a different communication standard. The memory controller 1160 may include various memory controllers, for example, a controller that controls integrated device electronics (IDE), serial advanced technology attachment (SATA), a small computer system interface (SCSI), redundant array of independent disks (RAID), a solid state disk (SSD), external SATA (eSATA), personal computer memory card international association (PCMCIA), a universal serial bus (USB), a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), a compact flash (CF) card, and the like.

The media processor 1170 may process data processed by the processor 1100 and data input as an image, a voice, and other formats from an external input device, and may output the data to an external interface device. The media processor 1170 may include a graphics processing unit (GPU), a digital signal processor (DSP), high-definition audio (HD Audio), high-definition multimedia interface (HDMI) controller, and the like.

Figure 16:
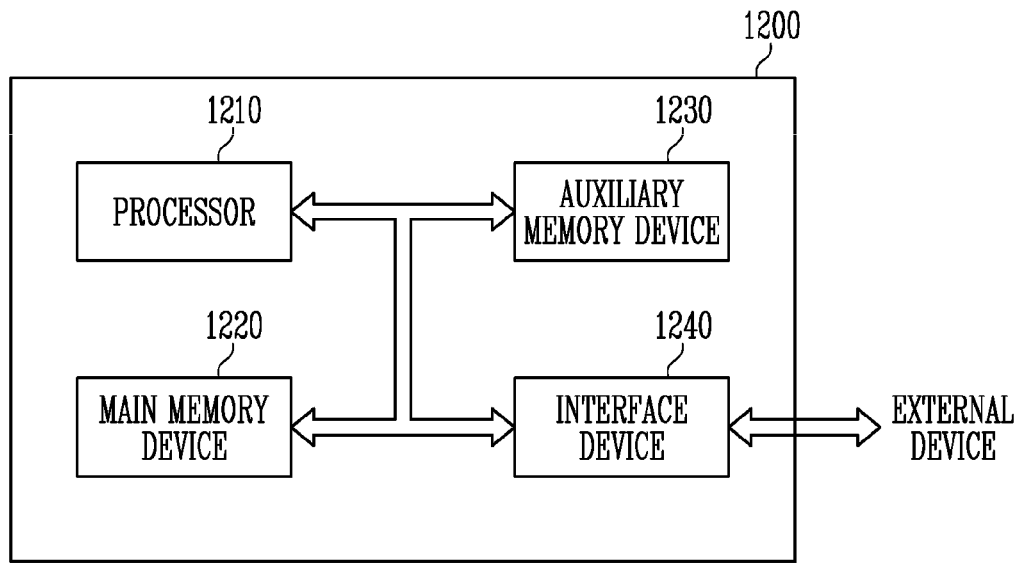
FIG. 16 is a configuration diagram of a system implementing a memory device according to an embodiment of the present disclosure.

FIG. 16 is a configuration diagram of a system implementing a memory device according to an embodiment of the present disclosure.

Referring to FIG. 16, a system 1200 is a device that processes data, and may perform input, process, output, communication, storage, and the like in order to perform a series of operations on data. The system 1200 may include a processor 1210, a main memory device 1220, an auxiliary memory device 1230, an interface device 1240, and the like. The system 1200 of the present embodiment may be various electronic systems operating using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, telematics, an audio visual system, a smart television, or the like.

The processor 1210 may control processes of analysis of an input command, an operation, comparison, and the like of data stored in the system 1200. The processor 1210 may include a microprocessor unit (MPU), a central processing unit (CPU), a single/multi core processor, a graphic processing unit (GPU), an application processor (AP), a digital signal processor (DSP), and the like.

The main memory device 1220 is a memory capable of moving, storing, and executing a program code or data from the auxiliary memory device 1230 when the program is executed. A memory content may be preserved in the main memory device 1220 even though power is shut off. The main memory device 1220 may include one or more embodiments of the electronic device described above.

In addition, the main memory device 1220 may further include a static random access memory (SRAM), a dynamic random access memory (DRAM), or the like of a volatile memory type in which all contents are erased when power is turned off. Alternatively, the main memory device 1220 may not include the electronic device of the embodiment described above and may further include a static random access memory (SRAM), a dynamic random access memory (DRAM), or the like of a volatile memory type in which all contents are erased when power is turned off.

The auxiliary memory device 1230 refers to a memory device for storing a program code or data. The auxiliary memory device 1230 is slower than the main memory device 1220 but may store a lot of data. The auxiliary memory device 1230 may include one or more embodiments of the electronic device described above.

In addition, the auxiliary memory device 1230 may further include a data storage system such as a magnetic tape using magnetism, a magnetic disk, a laser disk using light, a magneto-optical disk using the magnetism and light, a solid state disk (SSD), a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card. Alternatively, the auxiliary memory device 1230 may not include the electronic device of the embodiment described above.

The interface device 1240 may be for exchanging an instruction, data, and the like between the system 1200 of the present embodiment and an external device. The interface device 1240 may be a keypad, a keyboard, a mouse, a speaker, a microphone, a display, various human interface devices (HIDs), a communication device, and the like. The communication device may include a module capable of connecting with a wired network, a module capable of connecting with a wireless network, and both of the modules capable of connecting with a wired network and the module capable of connecting with a wireless network. A wired network module may include a local area network (LAN), a universal serial bus (USB), an Ethernet, a power line communication (PLC), or the like, as various devices that transmit and receive data through a transmission line. A wireless network module may include an infrared data association (IrDA), a code division multiple access (CDMA), a time division multiple access (TDMA), a frequency division multiple access (FDMA), a wireless LAN, Zigbee, a ubiquitous sensor network (USN), Bluetooth, radio frequency identification (RFID), long term evolution (LTE), near field communication (NFC), wireless broadband Internet (WIBRO), high speed downlink packet access (HSDPA), wideband CDMA (WCDMA), ultra wide band (UWB), and the like, as various devices that transmit and receive data without a transmission line.

Figure 17:
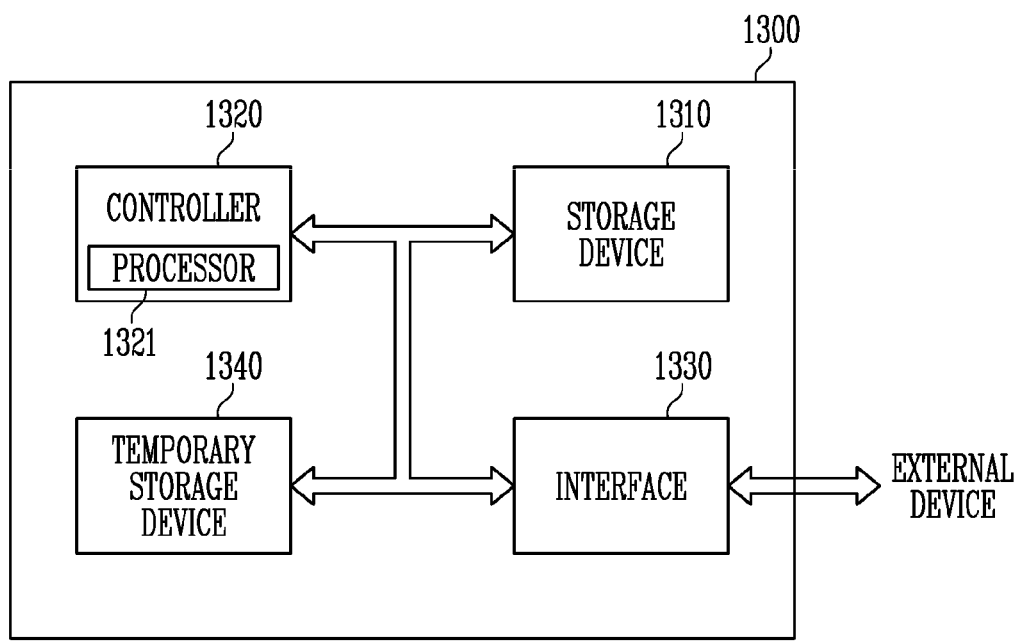
FIG. 17 is a configuration diagram of a data storage system implementing a memory device according to an embodiment of the present disclosure.

FIG. 17 is a configuration diagram of a data storage system implementing a memory device according to an embodiment of the present disclosure.

Referring to FIG. 17, the data storage system 1300 may include a storage device 1310 having a nonvolatile characteristic as a configuration for storing data, a controller 1320 that controls the storage device 1310, an interface 1330 for connection with an external device, and a temporary storage device 1340 for temporarily storing data. The data storage system 1300 may be a disk type such as a hard disk drive (HDD), a compact disk read only memory (CDROM), a digital versatile disk (DVD), and a solid state disk (SSD), and a card type such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The storage device 1310 may include a nonvolatile memory that semi-permanently stores data. Here, the nonvolatile memory may include a read only memory (ROM), a NOR flash memory, a NAND flash memory, a phase change random access memory (PRAM), a resistive random access memory (RRAM), a magnetic random access memory (MRAM), and the like.

The controller 1320 may control exchange of data between the storage device 1310 and the interface 1330. To this end, the controller 1320 may include a processor 1321 that performs an operation or the like for processing commands input through the interface 1330 from the outside of the data storage system 1300.

The interface 1330 is for exchanging an instruction, data, and the like between the data storage system 1300 and an external device. When the data storage system 1300 is a card, the interface 1330 may be compatible with an interface used in a device such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card, or may be compatible with an interface used in a device similar to these devices. When the data storage system 1300 is a disk type, the interface 1330 may be compatible with an interface such as integrated device electronics (IDE), serial advanced technology attachment (SATA), a small computer system interface (SCSI), external SATA (eSATA), personal computer memory card international association (PCMCIA), and a universal serial bus (USB), or may be compatible with an interface similar to these interfaces. The interface 1330 may be compatible with one or more interfaces having different types.

The temporary storage device 1340 may temporarily store data in order to efficiently transfer data between the interface 1330 and the storage device 1310 according to diversification and high performance of the interface with the external device, the controller, and the system. The temporary storage device 1340 may include one or more embodiments of the electronic device described above.

Figure 18:
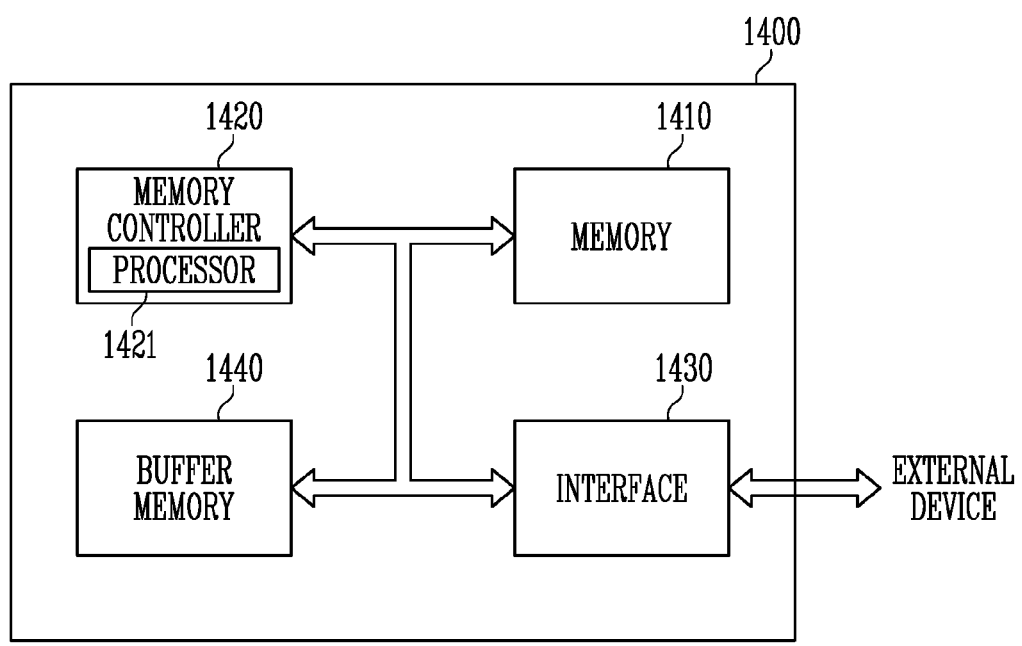
FIG. 18 is a configuration diagram of a memory system implementing a memory device according to an embodiment of the present disclosure.

FIG. 18 is a configuration diagram of a memory system implementing a memory device according to an embodiment of the present disclosure.

Referring to FIG. 18, the memory system 1400 may include a memory 1410 having a nonvolatile characteristic as a configuration for storing data, a memory controller 1420 that controls the memory 1410, an interface 1430 for connection with an external device, and the like. The memory system 1400 may be a card type such as a solid state disk (SSD), and a card type such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The memory 1410 that stores data may include one or more embodiments of the electronic device described above.

In addition, the memory of the present embodiment may include a read only memory (ROM), a NOR flash memory, a NAND flash memory, a phase change random access memory (PRAM), a resistive random access memory (RRAM), a magnetic random access memory (MRAM), and the like having a nonvolatile characteristic.

The memory controller 1420 may control exchange of data between the memory 1410 and the interface 1430. To this end, the memory controller 1420 may include a processor 1421 for processing and operating commands input through the interface 1430 from the outside of the memory system 1400.

The interface 1430 is for exchanging an instruction, data, and the like between the memory system 1400 and an external device. The interface 1430 may be compatible with an interface used in a device such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card, or may be compatible with an interface used in a device similar to these devices. The interface 1430 may be compatible with one or more interfaces having different types.

The memory system 1400 of the present embodiment may further include a buffer memory 1440 for efficiently transferring input/output of data between the interface 1430 and the memory 1410) according to diversification and high performance of the interface with the external device, the memory controller, and the memory system. The buffer memory 1440 that temporarily stores data may include one or more embodiments of the electronic device described above. For example, the buffer memory 1440 may include a row line, a column line crossing the row line, and a memory cell positioned between the row line and the column line, and including a first carbon electrode material and a second carbon electrode material formed on a surface of the first carbon electrode material and having a thickness of 100 Å or less. As a result, a read operation characteristic of the memory system 1400 may be improved.

In addition, the buffer memory 1440 of the present embodiment may further include a static random access memory (SRAM) and a dynamic random access memory (DRAM) having a volatile characteristic, a read only memory (ROM), a NOR flash memory, a NAND flash memory, a phase change random access memory (PRAM), a resistive random access memory (RRAM), a spin transfer torque random access memory (STTRAM), and a magnetic random access memory (MRAM) having a nonvolatile characteristic, and the like. Alternatively, the buffer memory 1440 may not include the electronic device of the embodiment described above, and may include a static random access memory (SRAM) and a dynamic random access memory (DRAM) having a volatile characteristic, a read only memory (ROM), a NOR flash memory, a NAND flash memory, a phase change random access memory (PRAM), a resistive random access memory (RRAM), a spin transfer torque random access memory (STTRAM), and a magnetic random access memory (MRAM) having a nonvolatile characteristic, and the like.

What is claimed is:

1. An electronic device comprising a semiconductor memory, wherein the semiconductor memory comprises:
   row lines each extending in a first direction;
   column lines each extending in a second direction crossing the first direction;
   memory cells positioned at intersections of the row lines and the column lines, and including first sidewalls facing in the first direction and second sidewalls facing in the second direction;
   first protective layers respectively formed on the second sidewalls of the memory cells; and
   second protective layers respectively formed on the first sidewalls of the memory cells, and
   wherein a group of the second protective layers partially surround a sidewall of a corresponding one of the column lines, and
   wherein the first protective layers and the second protective layers are separated from each other at corners where the first sidewalls and the second sidewalls meet each other.

2. The electronic device of claim 1, wherein the first protective layers and the second protective layers are disposed adjacent to each other at corners of each of the memory cells without wrapping around the corners.

3. The electronic device of claim 1, wherein the first protective layers are separated from each other in the first direction and the second direction, and
   wherein the second protective layers are separated from each other in the first direction and the second direction.

4. The electronic device of claim 1, wherein each of the first protective layers and each of the second protective layers are formed to have substantially the same thickness, and the first protective layers and the second protective layers include silicon nitride.

5. The electronic device of claim 1, wherein each of the first protective layers and each of the second protective layers have substantially the same thickness.

6. The electronic device of claim 1, wherein the corresponding one of the column lines includes first portions overlapping a group of the memory cells and second portions each overlapping a space between an adjacent pair of the group of the memory cells, and
   wherein the group of the second protective layers cover the first portions and expose the second portions.

7. The electronic device of claim 1, further comprising:
   an insulating layer buried in a space between an adjacent pair of the memory cells.

8. The electronic device of claim 7, wherein the insulating layer includes a low-K material having thermal conductivity lower than that of the first and second protective layers.

9. The electronic device of claim 7, wherein the insulating layer includes an SiOC material.

10. The electronic device of claim 9, wherein the insulating layer further includes hydrogen or nitrogen.

11. The electronic device of claim 1, wherein each of the memory cells includes two or more layers stacked in a vertical direction, and
    wherein any one of the two or more layers is a variable resistance layer.

12. A method of manufacturing an electronic device, the method comprising:
    forming a plurality of stack structures including a plurality of row lines and a plurality of variable resistance layers, respectively, each of the plurality of stack structures extending in a first direction;
    forming a first protective layer on sidewalls of the plurality of stack structures;
    forming a first insulating layer between the plurality of stack structures;
    forming column lines crossing the row lines on the first insulating layer;
    forming a plurality of stack patterns including memory cells positioned at intersections of the row lines and the column lines by etching the first insulating layer, the first protective layer, and the plurality of stack structures;
    forming a second protective layer on sidewalls of the plurality of stack patterns;
    forming a second insulating layer between the plurality of stack patterns;
    forming a mask pattern overlapping one or more of the column lines and one or more of the row lines on the second insulating layer; and
    etching the second protective layer using the mask pattern as an etch barrier,
    wherein the first protective layer is etched to form a plurality of remaining first protective layers, and the second protective layer is etched to form a plurality of remaining second protective layers, such that the remaining first protective layers and the remaining second protective layers are separated from each other at corners where the first sidewalls and the second sidewalls meet each other.

13. The method of claim 12, wherein etching the second protective layer comprises etching a portion of the second protective layer that does not overlap a corresponding one of the row lines.

14. The method of claim 12, wherein the mask pattern includes a plurality of open regions, and the plurality of open regions are arranged in a matrix form.

15. The method of claim 12, further comprising:
filling a third insulating layer between the plurality of stack patterns, after etching the second protective layer.

16. The method of claim 12, wherein the first protective layer and the second protective layer are formed of silicon nitride.

17. The method of claim 12, wherein the first insulating layer and the second insulating layer include a SiOC material, and
wherein the first insulating layer and the second insulating layer further include hydrogen or nitrogen.

18. The method of claim 12, wherein the first insulating layer and the second insulating layer include a material having thermal conductivity lower than that of the first and second protective layers.

19. A method of manufacturing an electronic device, the method comprising:
forming a plurality of stack structures including a plurality of first lines and a plurality of variable resistance layers, each of the plurality of stack structures extending in a first direction;
forming a first protective layer on sidewalls of the plurality of stack structures;
forming a first insulating layer between the plurality of stack structures;
forming second lines crossing the first lines on the first insulating layer;
forming a plurality of stack patterns including memory cells positioned at intersections of the first lines and the second lines by etching the first insulating layer, the first protective layer, and the plurality of stack structures;
forming a second protective layer on sidewalls of the plurality of stack patterns;
forming a second insulating layer between the plurality of stack patterns;
forming a mask pattern overlapping a corresponding one the first lines on the second insulating layer; and
etching the second protective layer using the mask pattern and the second lines as an etch barrier,
wherein in etching the second protective layer, the first protective layer formed on the sidewalls of the plurality of stack patterns is partially etched in thickness.

20. The method of claim 19, wherein etching the second protective layer comprises etching a portion of the second protective layer that does not overlap a corresponding one of the first lines.

21. The method of claim 19, wherein the first insulating layer and the second insulating layer include a material having thermal conductivity lower than that of the first protective layer and the second protective layer.

* * * * *